US012197035B2

United States Patent
Su et al.

(10) Patent No.: US 12,197,035 B2
(45) Date of Patent: Jan. 14, 2025

(54) IMAGING LENS MODULE AND ELECTRONIC DEVICE

(71) Applicant: LARGAN DIGITAL CO.,LTD., Taichung (TW)

(72) Inventors: Heng Yi Su, Taichung (TW); Ming-Ta Chou, Taichung (TW); Wen-Hung Hsu, Taichung (TW); Te-Sheng Tseng, Taichung (TW)

(73) Assignee: LARGAN DIGITAL CO.,LTD., Taichung (TW)

( * ) Notice: Subject to any disclaimer, the term of this patent is extended or adjusted under 35 U.S.C. 154(b) by 655 days.

(21) Appl. No.: 17/469,706

(22) Filed: Sep. 8, 2021

(65) Prior Publication Data

US 2022/0404577 A1    Dec. 22, 2022

Related U.S. Application Data

(60) Provisional application No. 63/212,100, filed on Jun. 17, 2021.

(51) Int. Cl.
*G02B 7/10* (2021.01)
*G01D 5/14* (2006.01)
(Continued)

(52) U.S. Cl.
CPC .............. *G02B 7/10* (2013.01); *G01D 5/145* (2013.01); *G02B 13/0065* (2013.01); *H05K 1/0277* (2013.01); *H05K 2201/1009* (2013.01)

(58) Field of Classification Search
CPC ...... G02B 7/10; G02B 13/0065; G01D 5/145; G03B 2205/0007; G03B 3/13; G03B 13/34; H02K 11/215

See application file for complete search history.

(56) References Cited

U.S. PATENT DOCUMENTS 7,589,920 B2   9/2009   Shin
8,582,205 B2 * 11/2013   Hasegawa ............ G02B 27/646
                                      348/208.99
(Continued)

FOREIGN PATENT DOCUMENTS

JP       H10170211 A    6/1998
KR     20120039743 A    4/2012
WO     2016157812 A1   10/2016

OTHER PUBLICATIONS

European Office Action dated Apr. 26, 2022 as received in application No. 21204483.8.
(Continued)

*Primary Examiner* — Zachary W Wilkes
(74) *Attorney, Agent, or Firm* — Maschoff Brennan

(57) ABSTRACT

An imaging lens module includes an imaging lens unit, an optical folding component and a sensing magnet group. The imaging lens unit has an optical axis. The optical folding component is configured to fold an incident optical path into the imaging lens unit to coincide with the optical axis. The sensing magnet group includes two sensing magnets that are sequentially disposed on the imaging lens unit along a direction in parallel with the optical axis. The sensing magnets are located at the same side with respect to a reference plane that passes through the optical axis and has a normal direction perpendicular to the optical axis. When the sensing magnets are observed from the direction in parallel with the optical axis, images of the sensing magnets are at least partially overlapped. Two adjacent magnetic poles of the sensing magnets are like poles between which there is a repulsive force.

14 Claims, 31 Drawing Sheets

(51) Int. Cl.
    *G02B 13/00*     (2006.01)
    *H05K 1/02*      (2006.01)

(56)             References Cited

U.S. PATENT DOCUMENTS 10,334,146 B2     6/2019   Im
    10,416,473 B2     9/2019   Lee
    10,534,194 B2 *   1/2020   Lee ..................... H04N 23/57
    10,594,911 B2     3/2020   Im
    10,678,062 B2     6/2020   Im
  2014/0218799 A1 *   8/2014   Suzuka ............. G02B 13/0065
                                                            359/557
  2015/0015729 A1 *   1/2015   Kasamatsu ........... H04N 23/54
                                                          348/208.11
  2015/0109485 A1     4/2015   Ozaki
  2018/0224665 A1     8/2018   Im
  2018/0364450 A1 * 12/2018    Lee ..................... H04N 23/55
  2021/0072495 A1     3/2021   Shin
  2024/0151930 A1 *   5/2024   Kao ....................... G03B 9/06
  2024/0272519 A1 *   8/2024   Go ....................... H02K 33/18

OTHER PUBLICATIONS

Indian Office Action dated Dec. 27, 2022 as received in application No. 202134057426.

* cited by examiner

IMAGING LENS MODULE AND ELECTRONIC DEVICE

RELATED APPLICATIONS

This application claims priority to U.S. Provisional Application 63/212,100, filed on Jun. 17, 2021, which is incorporated by reference herein in its entirety.

BACKGROUND

Technical Field

The present disclosure relates to an imaging lens system, an image capturing unit and an electronic device, more particularly to an imaging lens system and an image capturing unit applicable to an electronic device.

Description of Related Art

With the development of semiconductor manufacturing technology, the performance of image sensors has been improved, and the pixel size thereof has been scaled down. Therefore, featuring high image quality becomes one of the indispensable features of an optical system nowadays. Furthermore, due to the rapid changes in technology, electronic devices equipped with optical systems are trending towards multi-functionality for various applications, and therefore the functionality requirements for the optical systems have been increasing.

In recent years, there is an increasing demand for electronic devices featuring compact size, but conventional optical systems, especially the telephoto optical systems with a long focal length, are difficult to meet both the requirements of high image quality and miniaturization. Conventional telephoto optical systems usually have shortcomings of poor zooming position, thereby unable to meet the requirements of the current technology trends. Therefore, how to improve the zooming position accuracy of the telephoto optical systems for meeting the requirement of high-end-specification electronic devices is an important topic in this field nowadays.

SUMMARY

According to one aspect of the present disclosure, an imaging lens module includes at least one imaging lens unit, an optical folding component and a sensing magnet group. The at least one imaging lens unit includes at least one plastic lens barrel and at least one plastic lens element group and has an optical axis. The at least one plastic lens element group is accommodated in the at least one plastic lens barrel. The optical axis passes through the at least one plastic lens element group. The optical folding component is configured to fold an incident optical path into the at least one imaging lens unit to coincide with the optical axis. The sensing magnet group includes at least two sensing magnets that are sequentially disposed on the at least one plastic lens barrel along a direction in parallel with the optical axis. The at least two sensing magnets are located at the same side with respect to a reference plane that passes through the optical axis, and the reference plane has a normal direction perpendicular to the optical axis. When the at least two sensing magnets are observed from the direction in parallel with the optical axis, images of the at least two sensing magnets are at least partially overlapped. Two adjacent magnetic poles of the at least two sensing magnets are like poles between which there is a repulsive force. When a shortest distance along the direction in parallel with the optical axis between two magnetic like poles among the at least two sensing magnets is Dp, a longest distance along the direction in parallel with the optical axis between two magnetic poles among the at least two sensing magnets is Dm, and a total quantity of the at least two sensing magnets is Nt, the following condition is satisfied:

$$0.1 < Nt \times Dp/(Dm-(Nt-1) \times Dp) < 3.2.$$

According to another aspect of the present disclosure, an electronic device includes the aforementioned imaging lens module and an image sensor, wherein the image sensor is disposed on an image surface of the imaging lens module. The image sensor is configured to convert light passing through the at least one imaging lens unit into an optical image signal.

BRIEF DESCRIPTION OF THE DRAWINGS

The disclosure can be better understood by reading the following detailed description of the embodiments, with reference made to the accompanying drawings as follows.

DETAILED DESCRIPTION

Figure 1:
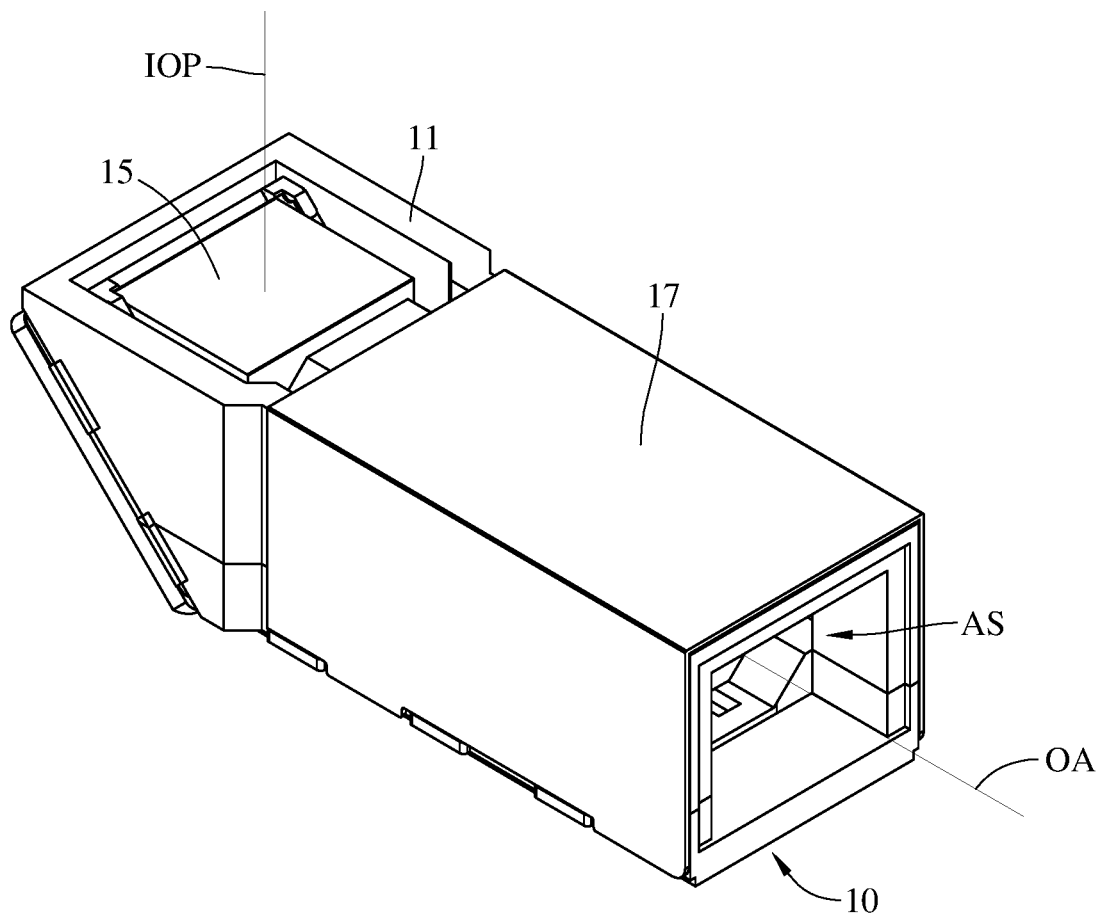
FIG. 1 is a perspective view of the imaging lens module according to the 1st embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

The present disclosure provides an imaging lens module that can include a base, a frame component, a plurality of rollable supporters, at least one imaging lens unit, an optical folding component, a sensing magnet group, a flexible printed circuit board, a driving coil group and a hall sensing component group.

The frame component can be coupled to the base so as to form an accommodation space therebetween.

The at least one imaging lens unit is movably located in the accommodation space. Specifically, the at least one imaging lens unit includes at least one plastic lens barrel and at least one plastic lens element group and has an optical axis. The at least one plastic lens barrel is movably supported by the base. The at least one plastic lens element group is accommodated in the at least one plastic lens barrel. The optical axis passes through the at least one plastic lens element group. Moreover, the base can have a guide groove that can extend along a direction in parallel with the optical axis and face the at least one imaging lens unit so as to guide the movement of the at least one imaging lens unit. Therefore, it is favorable for stabilizing the movement process of the at least one imaging lens unit. Moreover, the at least one imaging lens unit can also be movably supported by the base via the plurality of rollable supporters. That is, the plurality of rollable supporters can be located in the accommodation space and disposed between the at least one imaging lens unit and the base. Therefore, it is favorable for reducing sliding friction resistance generated in the movement process of the at least one imaging lens unit. Moreover, the rollable supporters can be disposed in the guide groove. Therefore, it is favorable for maintaining a relatively high driving collimation of the at least one imaging lens unit.

The optical folding component can be located in the accommodation space and can be disposed at an object side of the at least one imaging lens unit. The optical folding component can be a reflection mirror or a prism for folding an incident optical path into the at least one imaging lens unit to coincide with the optical axis. Therefore, it is favorable for miniaturizing the imaging lens module.

The sensing magnet group can be located in the accommodation space. Specifically, the sensing magnet group includes at least two sensing magnets that are sequentially disposed on the at least one plastic lens barrel along a direction in parallel with the optical axis. The at least two sensing magnets are located at the same side with respect to a reference plane that passes through the optical axis, and the reference plane has a normal direction perpendicular to the optical axis. Moreover, when the at least two sensing magnets are observed from the direction in parallel with the optical axis, images of the at least two sensing magnets are at least partially overlapped. Therefore, it is favorable for having flux density not excessively changed in the direction in parallel with the optical axis. Moreover, the sensing magnet group can also include three or more sensing magnets. Please refer to FIG. 7, which is a chart showing flux density corresponding to the configuration of the sensing magnet group.

Two adjacent magnetic poles of the at least two sensing magnets are like poles between which there is a repulsive force. Moreover, the adjacent two magnetic like poles can be spaced apart from each other so as to ensure continuity of flux density. Therefore, it is favorable for ensuring sufficient flux density between the adjacent two magnetic like poles, and it is also favorable for ensuring that a release point will not exist in the period where hysteresis of the hall sensing component group occurs.

The flexible printed circuit board can be supported by the frame component. The flexible printed circuit board has flexibility. Therefore, it is favorable for further miniaturizing the imaging lens module.

The driving coil group can be disposed on the flexible printed circuit board along a direction in parallel with the optical axis. Moreover, the driving coil group and the sensing magnet group can be disposed opposite to each other so as to generate a Lorentz force by electromagnetic interaction therebetween. The Lorentz force can be a magnetic driving force for moving the at least one plastic lens barrel along a direction in parallel with the optical axis. Moreover, the driving efficiency of the driving coil group can be optimized by a proper space configuration.

The hall sensing component group can include at least two hall sensing components that are sequentially soldered on the flexible printed circuit board along a direction in parallel with the optical axis. Moreover, the hall sensing component group can also include three or more hall sensing components. Moreover, the hall sensing component group and the sensing magnet group can be disposed opposite to each other so as to sense a displacement of the at least one plastic lens barrel along the direction in parallel with the optical axis. Specifically, one of the at least two sensing magnets can be disposed corresponding to one of the at least two hall sensing component. When the sensing magnet is moved away from the corresponding hall sensing component due to the movement of the plastic lens barrel, the corresponding relationship therebetween can be replaced by another hall sensing component and the sensing magnet so as to sense the position of the sensing magnet, thereby obtaining the position of the plastic lens barrel which the sensing magnet is disposed on. Moreover, the sensing efficiency of the hall sensing component group can be optimized by a proper space configuration.

According to the present disclosure, the imaging lens module can further include at least one fixed imaging lens unit. The at least one fixed imaging lens unit includes at least one fixed plastic lens barrel and at least one fixed plastic lens element group that is accommodated in the at least one fixed plastic lens barrel. The at least one fixed imaging lens unit is immovable with respect to the base, while the at least one imaging lens unit is movable with respect to the base. Therefore, it is favorable for responding to an optical design requirement that only partial lens elements are moved for achieving zooming function so as to increase design flexibility and correspond to a relatively high-end optical requirement. Please refer to FIG. 3, FIG. 7 and FIG. 23, which respectively show the fixed imaging lens units 14, 34 and 44 according to the 1st, 3rd and 4th embodiments of the present disclosure.

According to the present disclosure, the imaging lens module can further include an optical image stabilizer configured to be disposed on an image sensor for stabilizing an optical image signal on an image sensor converted from light passing through the at least one imaging lens unit. Therefore, it is favorable for providing a more reliable method for capturing the optical image signal so as to increase image quality. Please refer to FIG. 28 and FIG. 29, which show the optical image stabilizer 5a according to the 5th embodiment of the present disclosure.

According to the present disclosure, the imaging lens module can further include an auxiliary sensing magnet group, an auxiliary driving coil group and an auxiliary hall sensing component group that are disposed on the optical image stabilizer. Therefore, it is favorable for the auxiliary sensing magnet group, the auxiliary driving coil group and the auxiliary hall sensing component group to collaborate with one another, such that the image sensor is in a condition that can be driven so as to achieve an optical image stabilization function. Please refer to FIG. 28 and FIG. 29, which show the auxiliary sensing magnet group 5b, the auxiliary driving coil group 5c and the auxiliary hall sensing component group 5d according to the 5th embodiment of the present disclosure.

When a shortest distance along the direction in parallel with the optical axis between two magnetic like poles among the at least two sensing magnets is Dp, a longest distance along the direction in parallel with the optical axis between two magnetic poles among the at least two sensing magnets is Dm, and the total quantity of the at least two sensing magnets is Nt, the following condition is satisfied: $0.1 < Nt \times Dp/(Dm-(Nt-1) \times Dp) < 3.2$. Therefore, it is favorable for ensuring continuity of flux density between the sensing magnets, thereby accurately positioning the at least one plastic lens barrel. Moreover, the following condition can also be satisfied: $0.15 < Nt \times Dp/(Dm-(Nt-1) \times Dp) < 2$. Therefore, it is favorable for increasing the sensing accuracy of the hall sensing component group. Please refer to FIG. 7, which shows Dp and Dm according to the 1st embodiment of the present disclosure.

When the shortest distance along the direction in parallel with the optical axis between two magnetic like poles among the at least two sensing magnets is Dp, and the longest distance along the direction in parallel with the optical axis between two magnetic poles among the at least two sensing magnets is Dm, the following condition can be satisfied: $0 < Dp/Dm < 1$. Therefore, it is favorable for ensuring the sensing efficiency of the hall sensing component group. Moreover, the following condition can also be satisfied: $0.1 < Dp/Dm < 0.8$.

When the shortest distance along the direction in parallel with the optical axis between two magnetic like poles among the at least two sensing magnets is Dp, and a shortest distance along the direction in parallel with the optical axis between the at least two hall sensing components is Dh, the following condition can be satisfied: $0 < Dh/Dp < 3$. Therefore, it is favorable for ensuring flux density of the sensing magnets can be accurately sensed by the hall sensing component group. Please refer to FIG. 7, which shows Dp and Dh according to the 1st embodiment of the present disclosure.

According to the present disclosure, the aforementioned features and conditions can be utilized in numerous combinations so as to achieve corresponding effect.

According to the above description of the present disclosure, the following specific embodiments are provided for further explanation.

1st Embodiment

Figure 2:
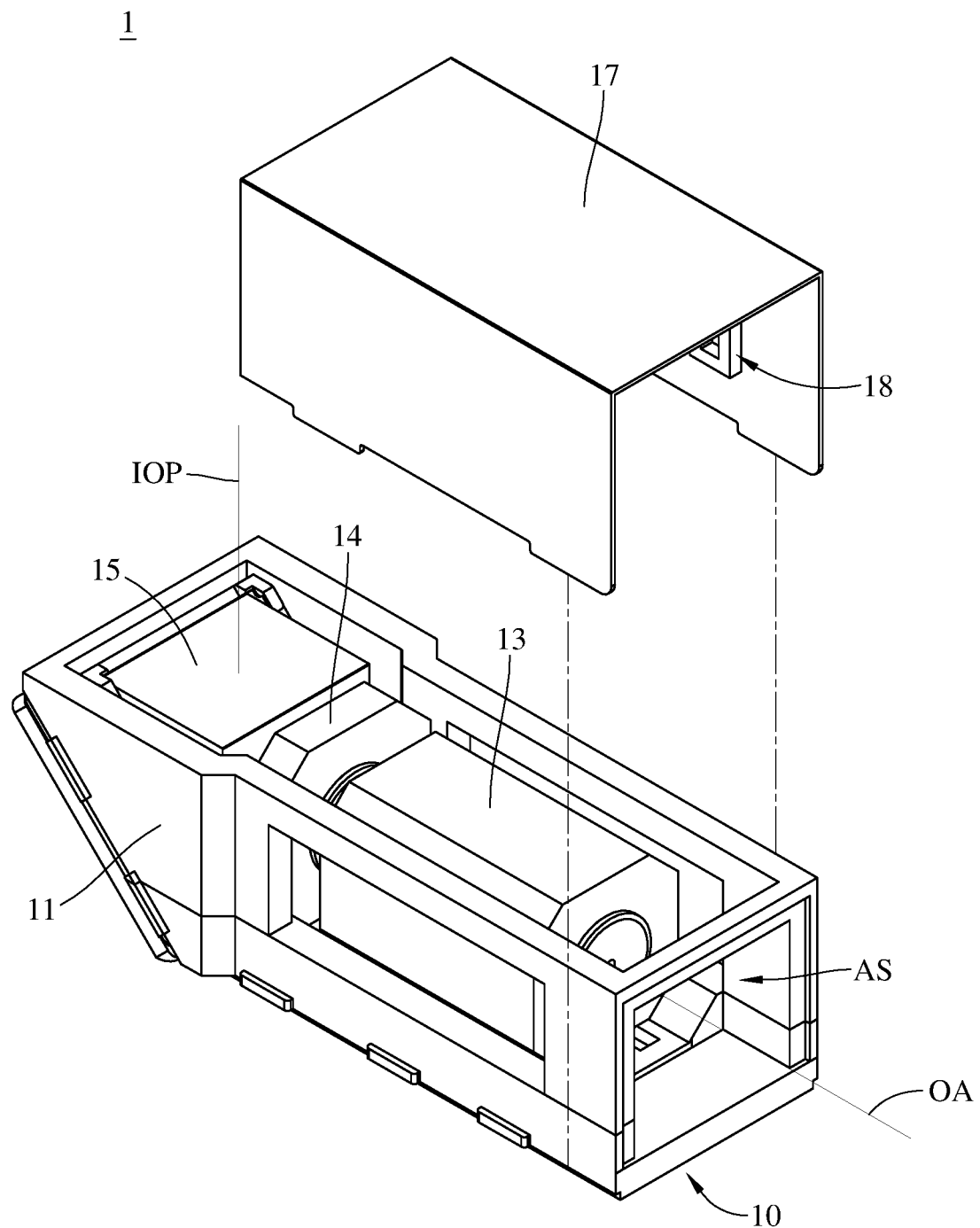
FIG. 2 is a partially exploded view of the imaging lens module in FIG. 1.
Figure 3:
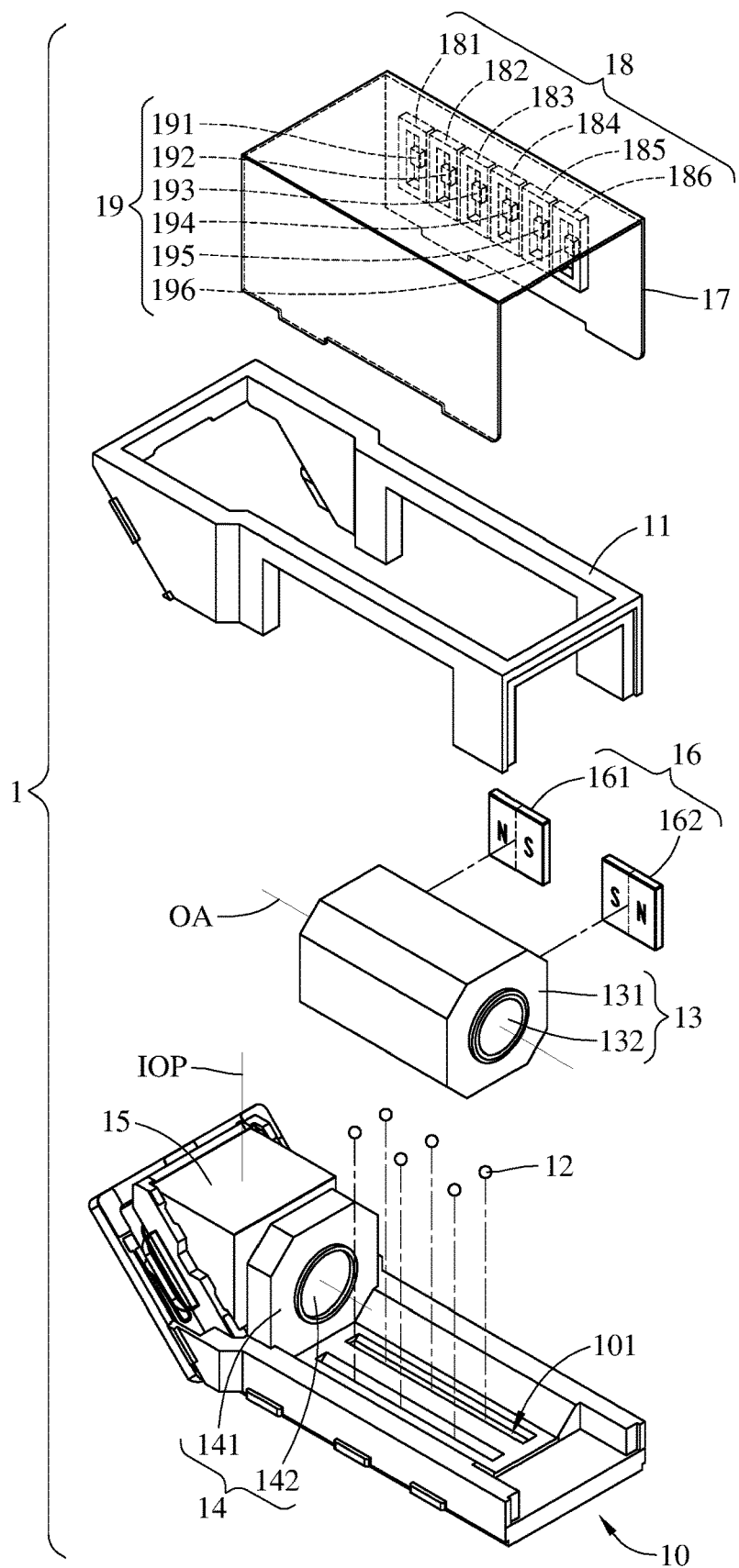
FIG. 3 is an exploded view of the imaging lens module in FIG. 1.
Figure 4:
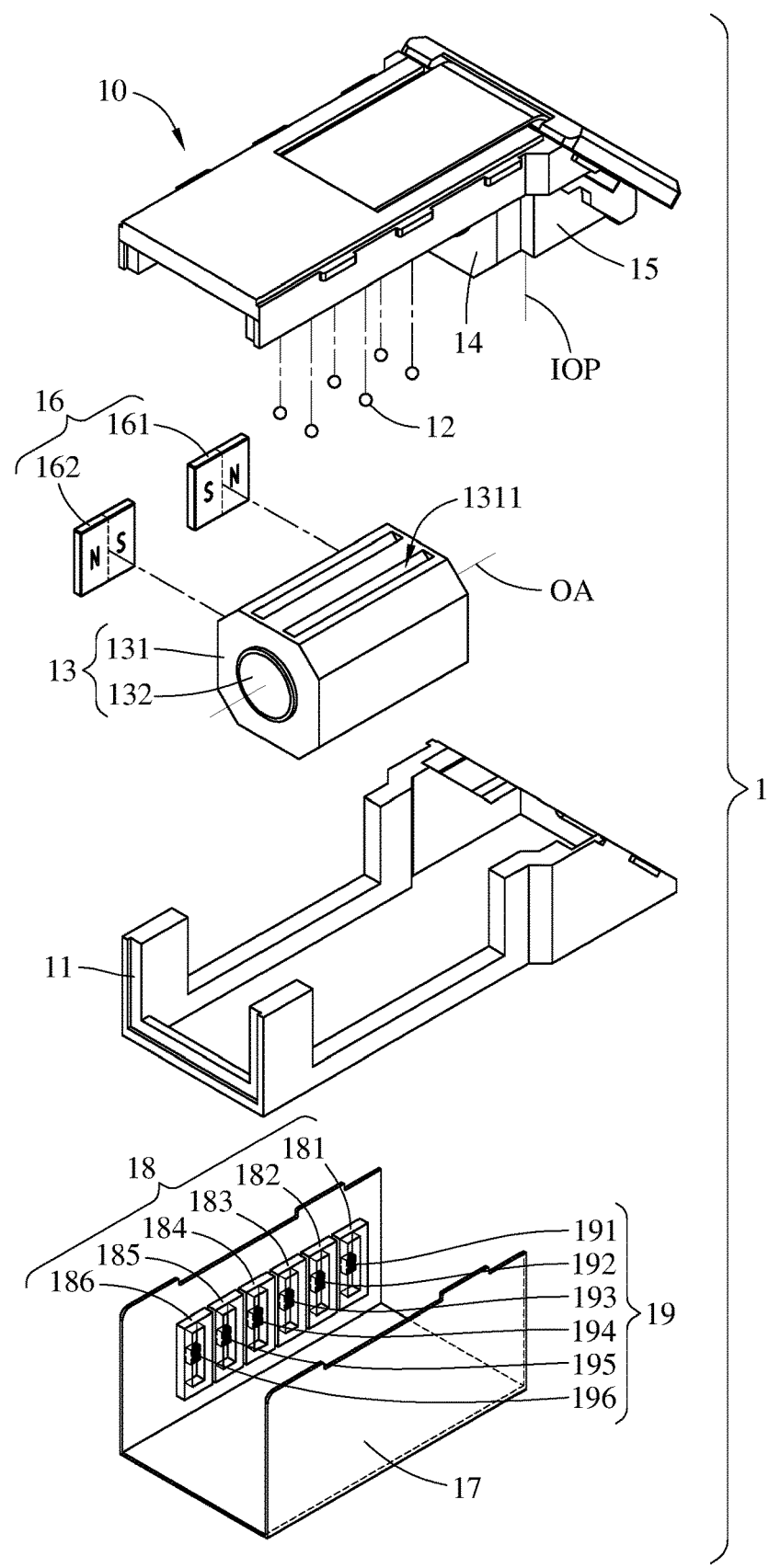
FIG. 4 is another exploded view of the imaging lens module in FIG. 1.
Figure 5:
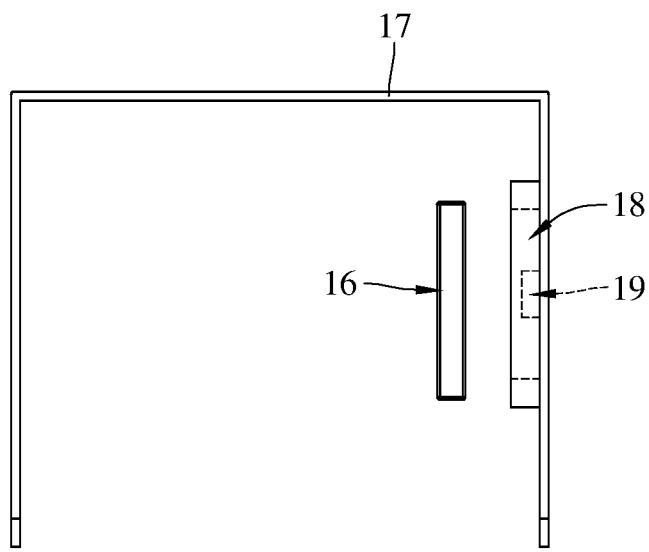
FIG. 5 is a front view showing the configuration of a flexible printed circuit board, a driving coil group, a hall sensing component group and a sensing magnet group of the imaging lens module in FIG. 1.
Figure 6:
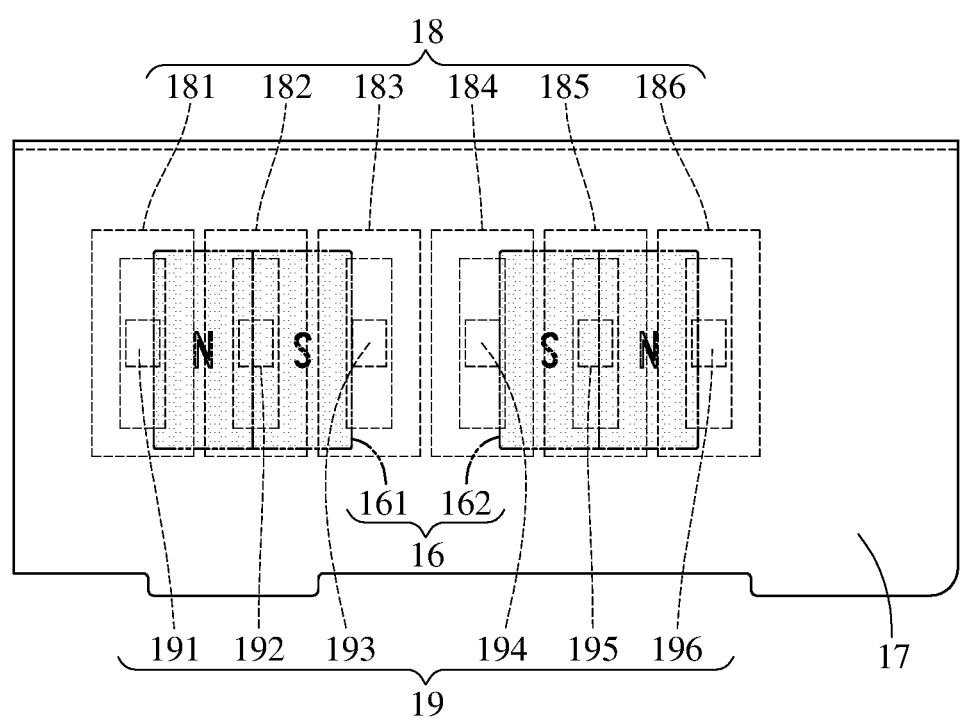
FIG. 6 is a side view showing the configuration of the flexible printed circuit board, the driving coil group, the hall sensing component group and the sensing magnet group of the imaging lens module in FIG. 1.
Figure 7:
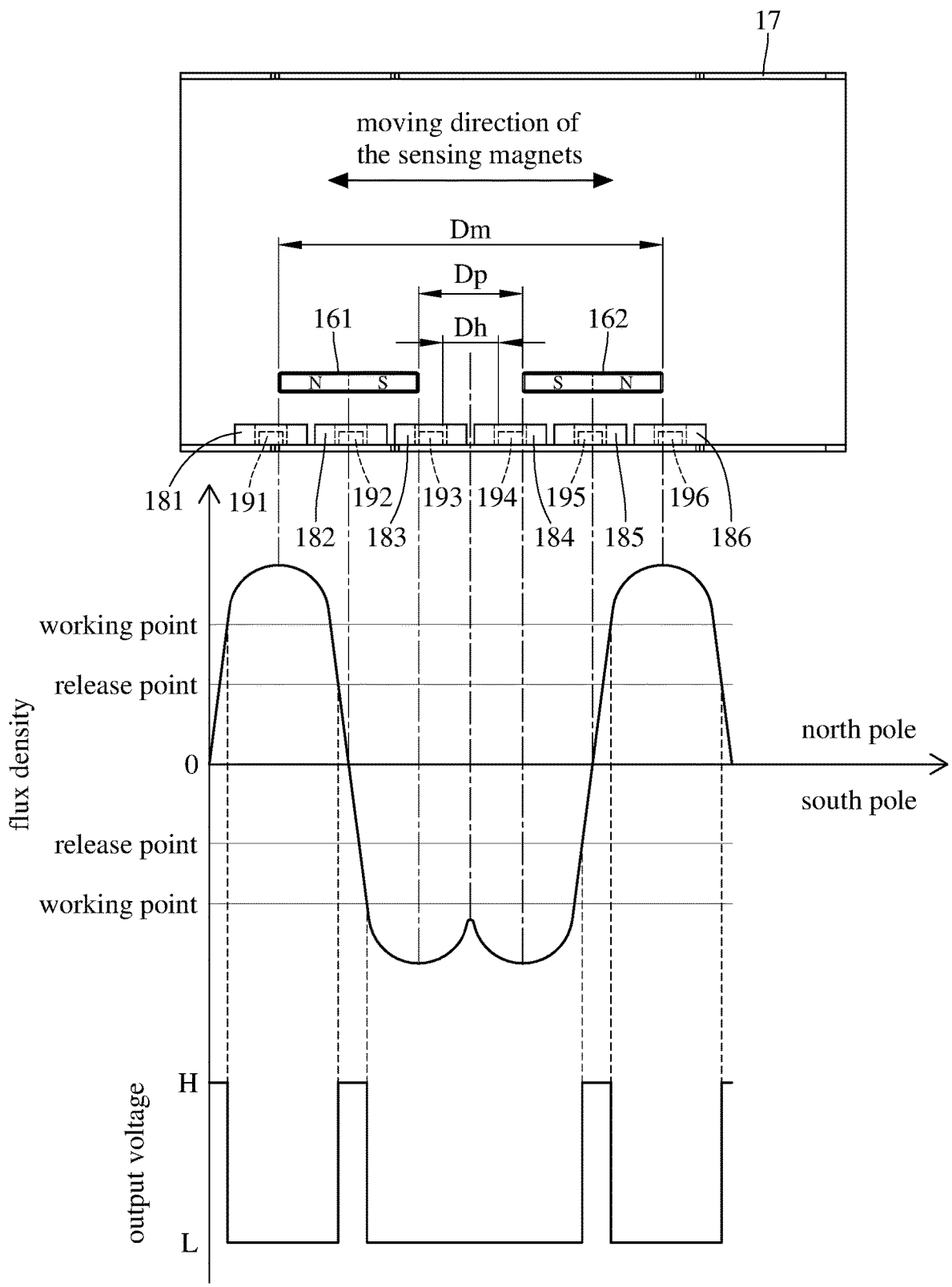
FIG. 7 is a chart showing flux density and output voltage corresponding to the configuration of the driving coil group, the hall sensing component group and the sensing magnet group in FIG. 5 and FIG. 6.

Please refer to FIG. 1 to FIG. 7, where FIG. 1 is a perspective view of the imaging lens module according to the 1st embodiment of the present disclosure, FIG. 2 is a partially exploded view of the imaging lens module in FIG. 1, FIG. 3 is an exploded view of the imaging lens module in FIG. 1, FIG. 4 is another exploded view of the imaging lens module in FIG. 1, FIG. 5 is a front view showing the configuration of a flexible printed circuit board, a driving coil group, a hall sensing component group and a sensing magnet group of the imaging lens module in FIG. 1, FIG. 6 is a side view showing the configuration of the flexible printed circuit board, the driving coil group, the hall sensing component group and the sensing magnet group of the imaging lens module in FIG. 1, and FIG. 7 is a chart showing flux density and output voltage corresponding to the configuration of the driving coil group, the hall sensing component group and the sensing magnet group in FIG. 5 and FIG. 6.

This embodiment provides an imaging lens module 1 that includes a base 10, a frame component 11, a plurality of rollable supporters 12, a movable imaging lens unit 13, a fixed imaging lens unit 14, an optical folding component 15, a sensing magnet group 16, a flexible printed circuit board 17, a driving coil group 18 and a hall sensing component group 19.

The base 10 has a plurality of guide grooves 101 that extend along the same direction.

The frame component 11 is coupled to the base 10 so as to form an accommodation space AS therebetween.

The rollable supporters 12 are located in the accommodation space AS and disposed in the guide grooves 101.

The movable imaging lens unit 13 is movably located in the accommodation space AS. Specifically, the movable imaging lens unit 13 includes a movable plastic lens barrel 131 and a movable plastic lens element group 132 and has an optical axis OA. The movable plastic lens barrel 131 has a plurality of guide grooves 1311 that face and correspond to the guide grooves 101 of the base 10. The rollable supporters 12 are sandwiched by the guide grooves 101 and 1311 and are able to roll along an extension direction of the guide grooves 101 and 1311, such that the movable plastic lens barrel 131 is movably supported by the base 10. The movable plastic lens element group 132 is accommodated in the movable plastic lens barrel 131 and is able to be moved with respect to the base 10 by the movable plastic lens barrel 131. The optical axis OA passes through the movable plastic lens element group 132, and a direction of the optical axis OA is in parallel with the extension direction of the guide grooves 101 and 1311.

The fixed imaging lens unit 14 is immovably located in the accommodation space AS and disposed at an object side of the movable imaging lens unit 13. The fixed imaging lens unit 14 includes a fixed plastic lens barrel 141 and a fixed plastic lens element group 142 that is accommodated in the fixed plastic lens barrel 141. Please be noted that each of the movable plastic lens element group 132 and the fixed plastic lens element group 142 can include one or more lens elements, and the present disclosure is not limited thereto.

The optical folding component 15 is located in the accommodation space AS and disposed at an object side of the fixed imaging lens unit 14. The optical folding component 15 may be a reflection mirror or a prism that is able to fold an incident optical path 10P from outside into the fixed imaging lens unit 14 and the movable imaging lens unit 13 so as to coincide with the optical axis OA.

The sensing magnet group 16 is located in the accommodation space AS. Specifically, the sensing magnet group 16 includes a first sensing magnet 161 and a second sensing magnet 162 that are sequentially disposed on the movable plastic lens barrel 131 along a direction in parallel with the optical axis OA. The first sensing magnet 161 and the second sensing magnet 162 are located at the same side with respect to a reference plane (not shown) that passes through the optical axis OA, and the reference plane has a normal direction perpendicular to the optical axis OA. That is, the optical axis OA is located on the reference plane. When the first sensing magnet 161 and the second sensing magnet 162 are observed from the direction in parallel with the optical axis OA, images of the first sensing magnet 161 and the second sensing magnet 162 are at least partially overlapped. Two adjacent magnetic poles of the first sensing magnet 161 and the second sensing magnet 162 are south poles between which there is a repulsive force.

The flexible printed circuit board 17 is supported by the frame component 11, and the flexible printed circuit board 17 has flexibility.

The driving coil group 18 is disposed on the flexible printed circuit board 17 along a direction in parallel with the optical axis OA. The driving coil group 18 includes six driving coils 181, 182, 183, 184, 185 and 186 that are opposite to the first sensing magnet 161 and the second sensing magnet 162 of the sensing magnet group 16. The driving coil group 18 and the sensing magnet group 16 generate a Lorentz force by electromagnetic interaction therebetween that can be a magnetic driving force for moving the movable plastic lens barrel 131 along a direction in parallel with the optical axis OA. When the movable plastic lens barrel 131 is in its original position, the first sensing magnet 161 corresponds to three driving coils 181, 182 and 183, and the second sensing magnet 162 corresponds to another three driving coils 184, 185 and 186, such that the first sensing magnet 161 and the second sensing magnet 162 can at least partially opposite to the driving coils 181, 182, 183, 184, 185 and 186 after moving the movable plastic lens barrel 131, thereby ensuring a sufficient magnetic driving force can be continuously generated therebetween.

The hall sensing component group 19 includes six hall sensing components 191, 192, 193, 194, 195 and 196 that are sequentially soldered on the flexible printed circuit board 17 along a direction in parallel with the optical axis OA and may be respectively located at central positions of the driving coils 181, 182, 183, 184, 185 and 186, as shown in FIG. 4. When the movable plastic lens barrel 131 is in its original position, the first sensing magnet 161 corresponds to three hall sensing components 191, 192 and 193, and the second sensing magnet 162 corresponds to another three hall sensing components 194, 195 and 196, such that the first sensing magnet 161 and the second sensing magnet 162 can at least partially opposite to the hall sensing components 191, 192, 193, 194, 195 and 196 after moving the movable plastic lens barrel 131, thereby accurately sensing the positions of the first sensing magnet 161 and the second sensing magnet 162, then obtaining the position of the movable plastic lens barrel 131, and thus calculating the displacement of the movable plastic lens barrel 131.

Specifically, by a proper space configuration, flux density generated by the sensing magnet group 16 along the direction in parallel with the optical axis OA can be referred to the chart in FIG. 7. As shown in FIG. 7, the flux density changes along the direction in parallel with the optical axis OA according to the positions of the magnetic poles of the first sensing magnet 161 and the second sensing magnet 162, and an output voltage can be generated on the hall sensing component group 19 from a release point to a working point of the flux density. The hall sensing component group 19 can obtain the high potential H and the low potential L of the output voltage to deduce the position of each magnetic pole of the sensing magnet group 16, thereby timely obtaining the position of the movable plastic lens barrel 131. Note that the proper space configuration will be achieved by the following conditions.

When a shortest distance along the direction in parallel with the optical axis OA between two magnetic south poles among the first sensing magnet 161 and the second sensing magnet 162 is Dp, a longest distance along the direction in parallel with the optical axis OA between two magnetic poles among the first sensing magnet 161 and the second sensing magnet 162 is Dm, and the total quantity of the sensing magnets of the sensing magnet group 16 is Nt, the following conditions are satisfied: Dp=2.62 [mm]; Dm=9.62 [mm]; Nt=2; and Nt×Dp/(Dm−(Nt−1)×Dp)=0.75.

When the shortest distance along the direction in parallel with the optical axis OA between two magnetic south poles among the first sensing magnet 161 and the second sensing magnet 162 is Dp, and the longest distance along the direction in parallel with the optical axis OA between two magnetic poles among the first sensing magnet 161 and the second sensing magnet 162 is Dm, the following condition is satisfied: Dp/Dm=0.27.

When the shortest distance along the direction in parallel with the optical axis OA between two magnetic south poles among the first sensing magnet 161 and the second sensing magnet 162 is Dp, and a shortest distance along the direction in parallel with the optical axis OA between the hall sensing components 191, 192, 193, 194, 195 and 196 is Dh, the following condition is satisfied: Dh=1.40 [mm]; and Dh/Dp=0.53.

2nd Embodiment

Figure 8:
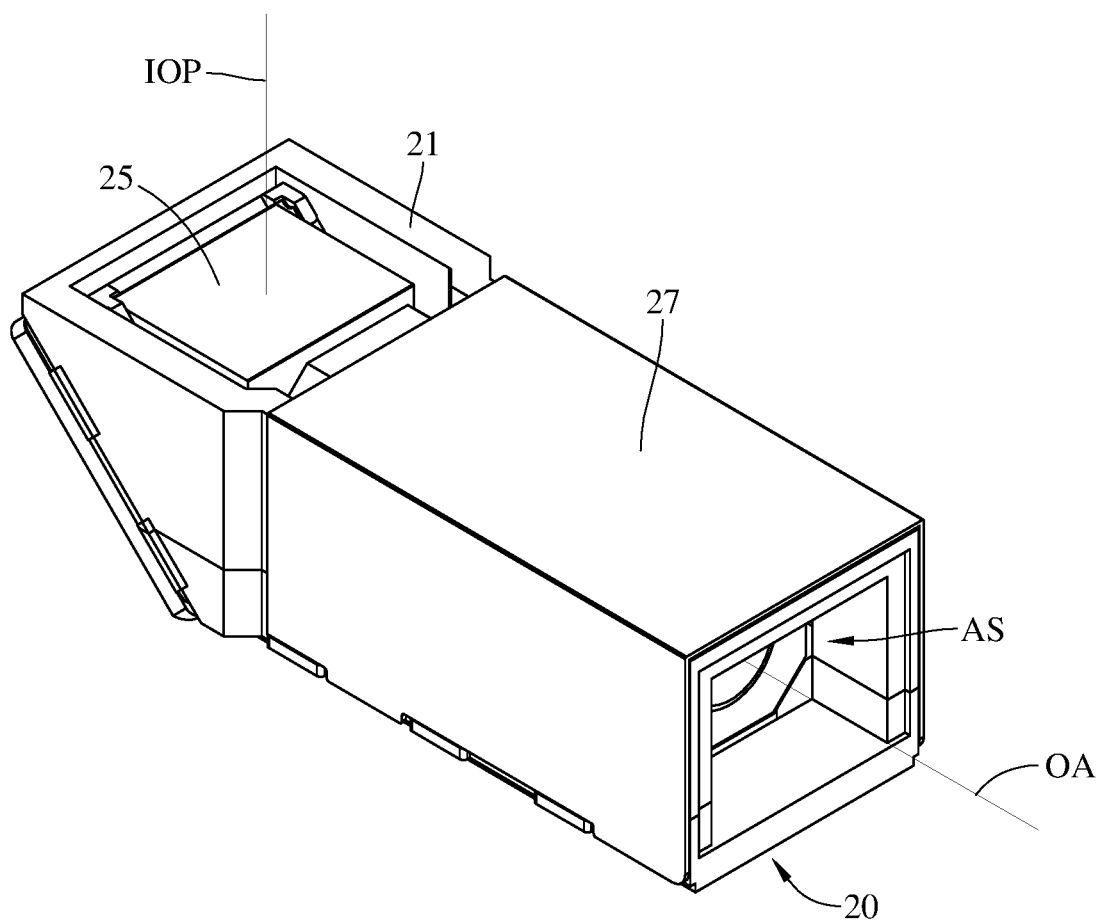
FIG. 8 is a perspective view of the imaging lens module according to the 2nd embodiment of the present disclosure.
Figure 9:
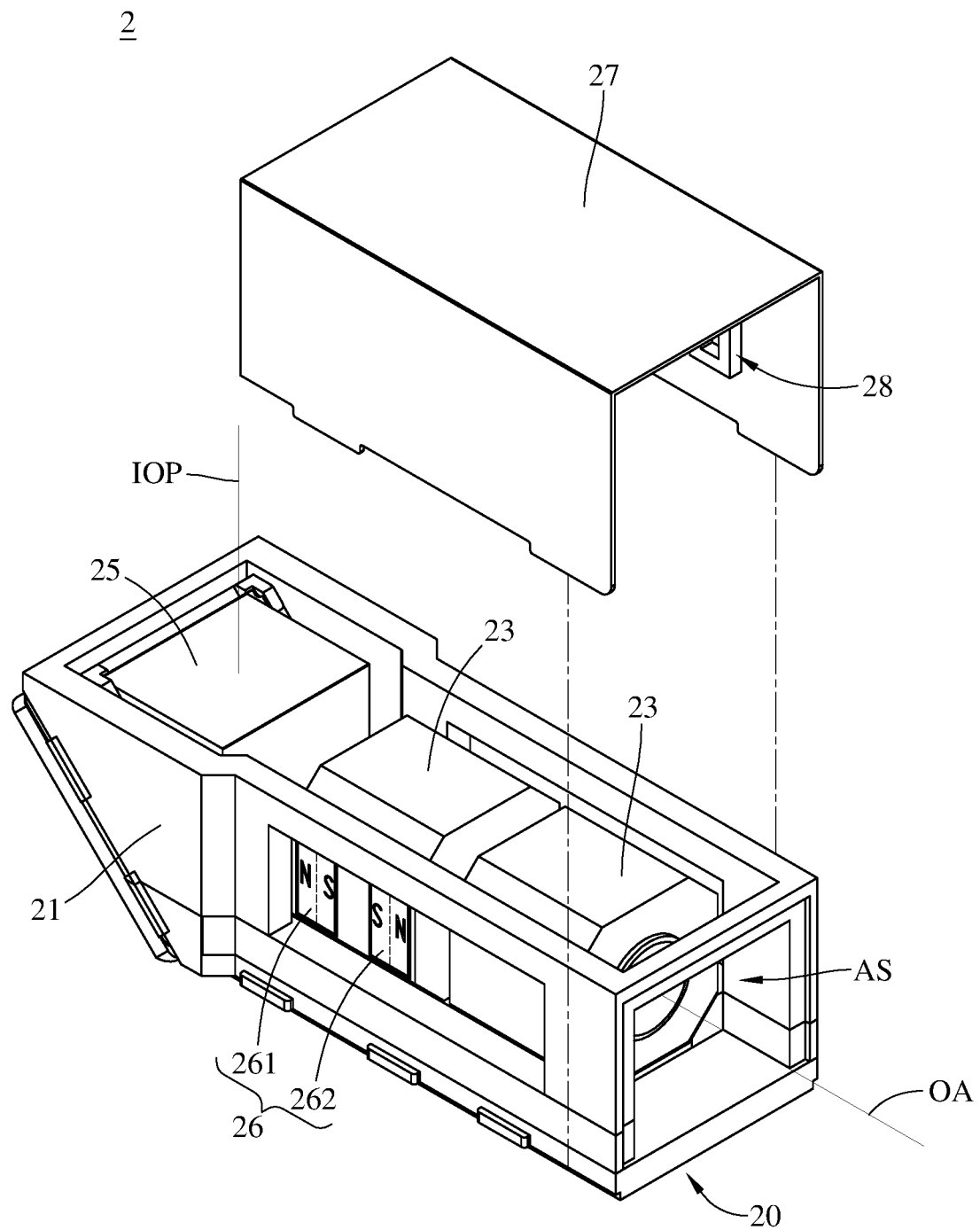
FIG. 9 is a partially exploded view of the imaging lens module in FIG. 8.
Figure 10:
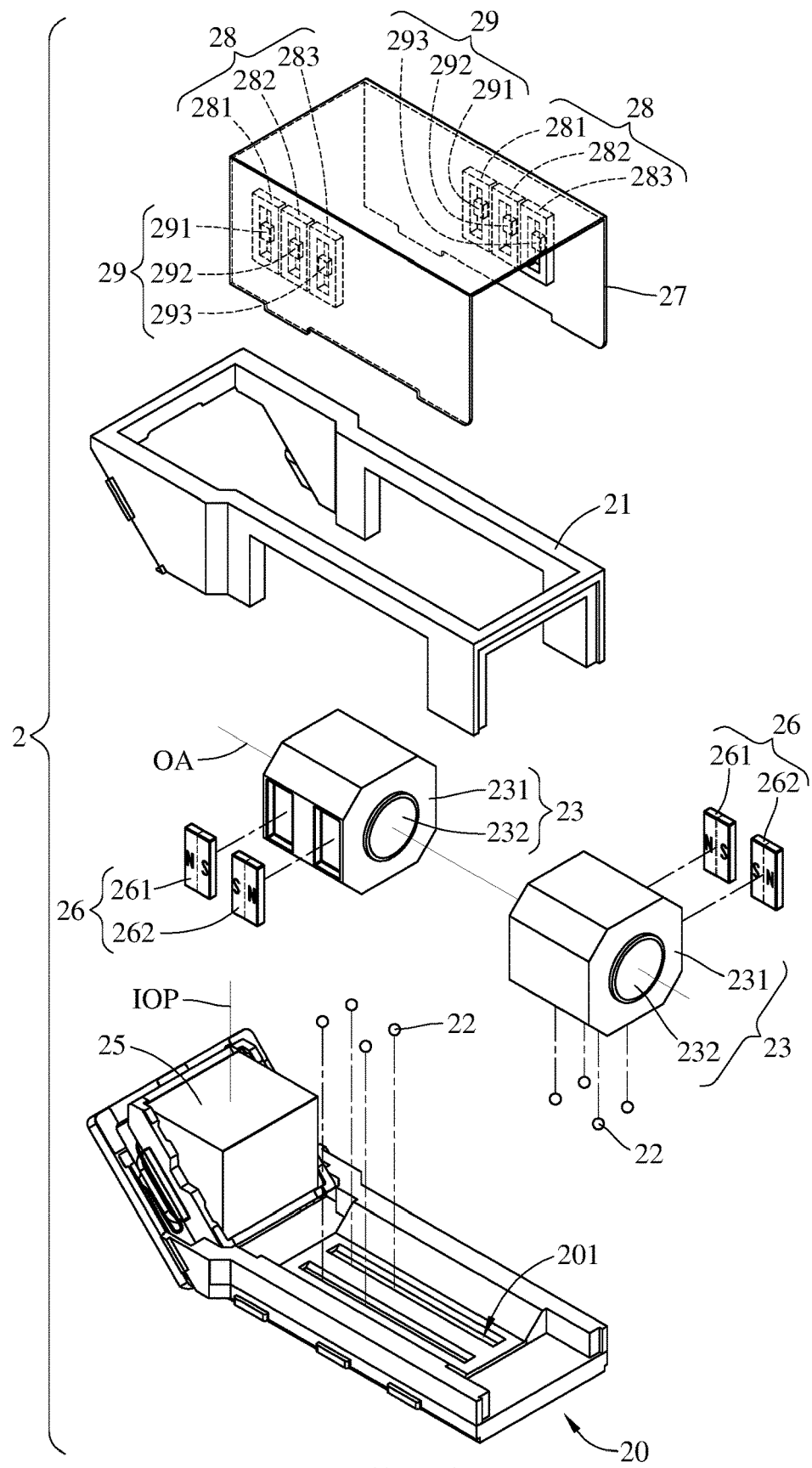
FIG. 10 is an exploded view of the imaging lens module in FIG. 8.
Figure 11:
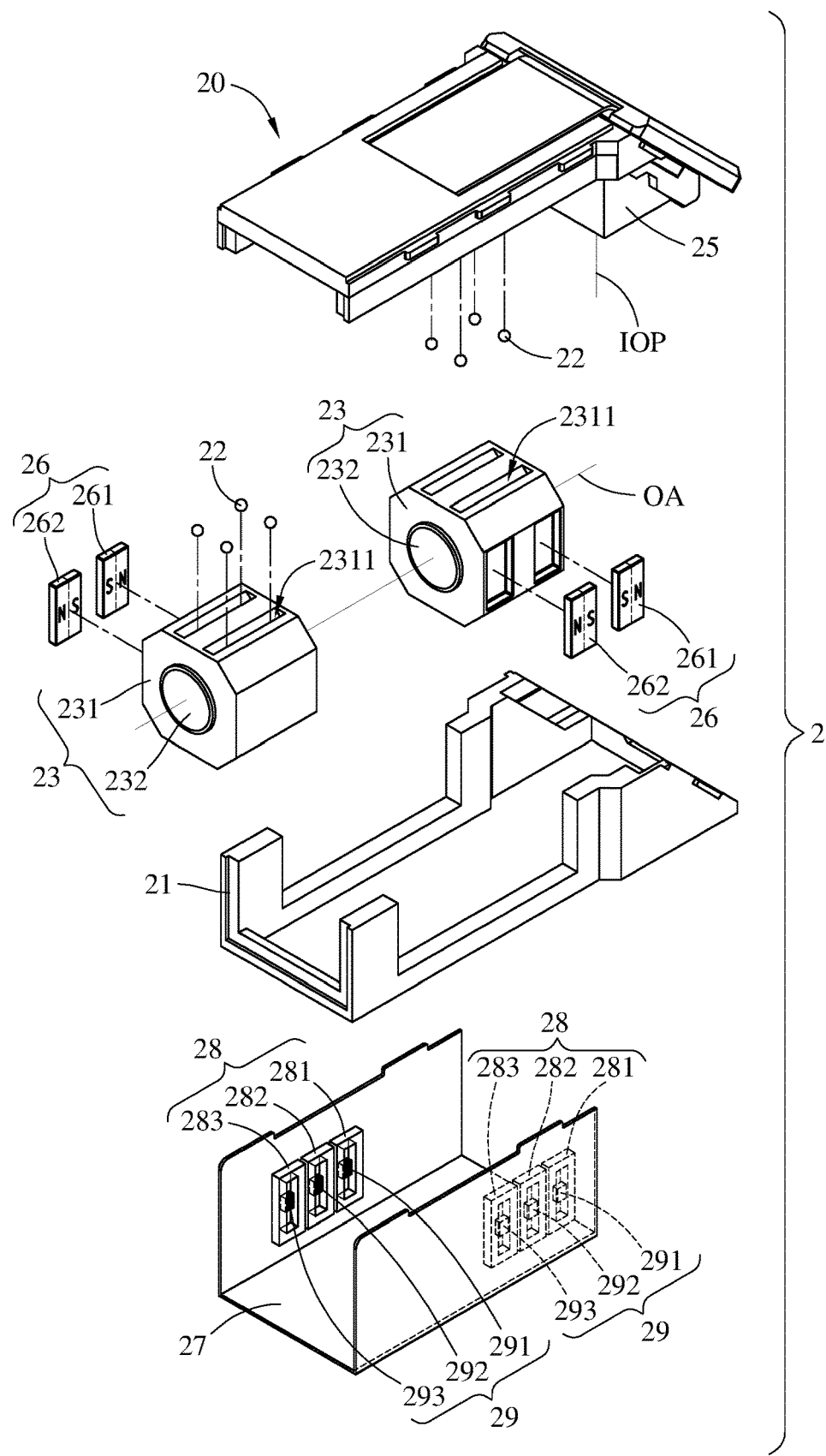
FIG. 11 is another exploded view of the imaging lens module in FIG. 8.
Figure 12:
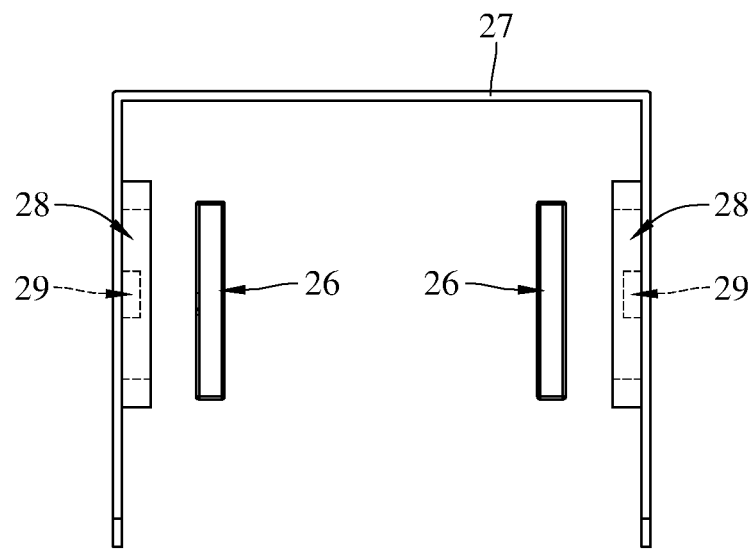
FIG. 12 is a front view showing the configuration of a flexible printed circuit board, a driving coil group, a hall sensing component group and a sensing magnet group of the imaging lens module in FIG. 8.
Figure 13:
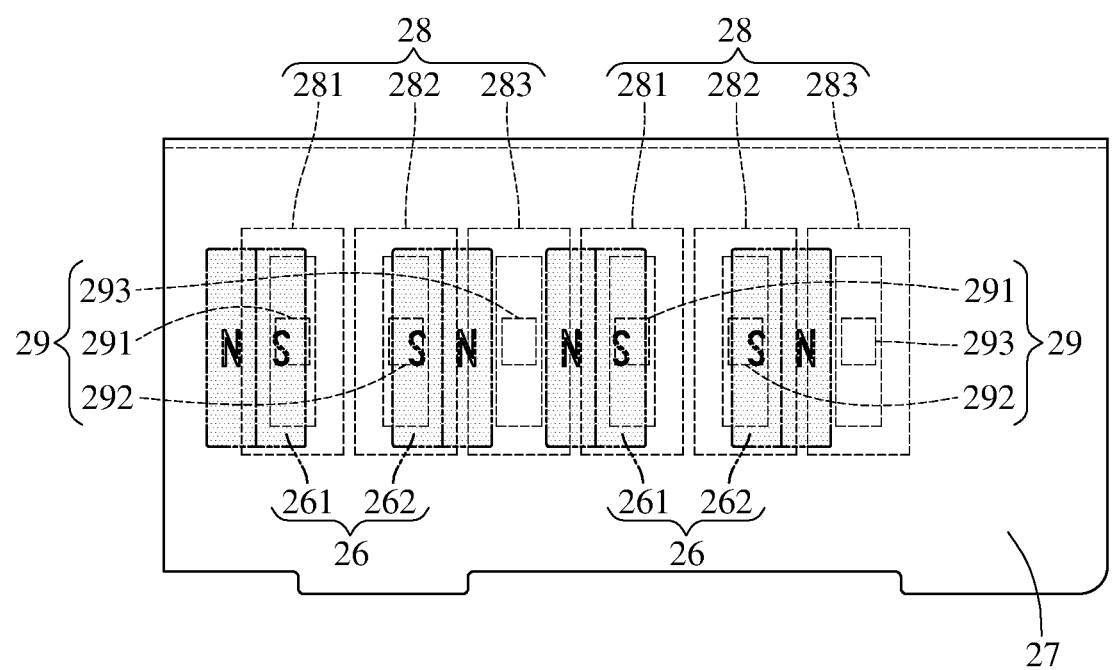
FIG. 13 is a side view showing the configuration of the flexible printed circuit board, the driving coil group, the hall sensing component group and the sensing magnet group of the imaging lens module in FIG. 8.
Figure 14:
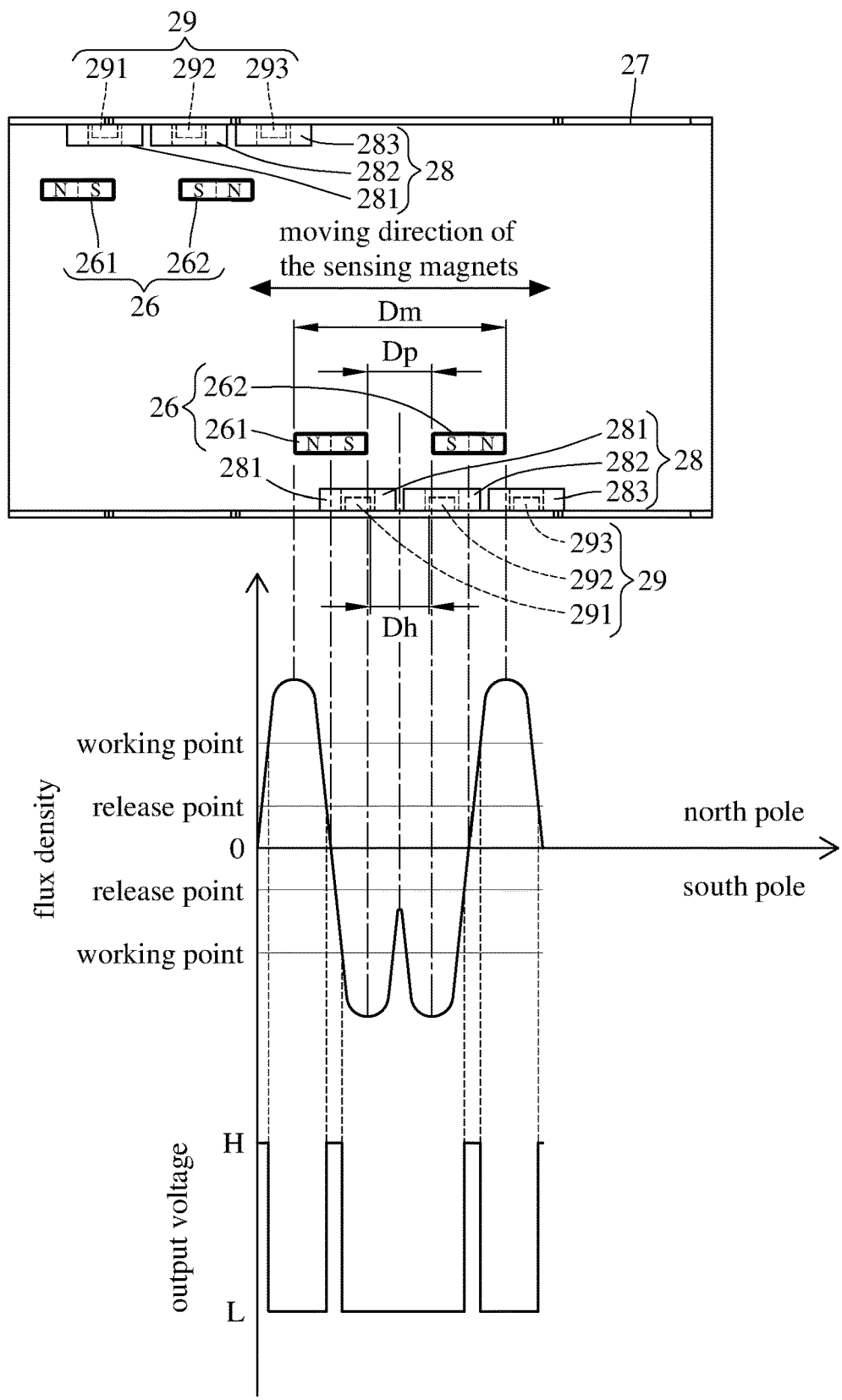
FIG. 14 is a chart showing flux density and output voltage corresponding to the configuration of the driving coil group, the hall sensing component group and the sensing magnet group in FIG. 12 and FIG. 13.

Please refer to FIG. 8 to FIG. 14, where FIG. 8 is a perspective view of the imaging lens module according to the 2nd embodiment of the present disclosure, FIG. 9 is a partially exploded view of the imaging lens module in FIG. 8, FIG. 10 is an exploded view of the imaging lens module in FIG. 8, FIG. 11 is another exploded view of the imaging lens module in FIG. 8, FIG. 12 is a front view showing the configuration of a flexible printed circuit board, a driving coil group, a hall sensing component group and a sensing magnet group of the imaging lens module in FIG. 8, FIG. 13 is a side view showing the configuration of the flexible printed circuit board, the driving coil group, the hall sensing component group and the sensing magnet group of the imaging lens module in FIG. 8, and FIG. 14 is a chart showing flux density and output voltage corresponding to the configuration of the driving coil group, the hall sensing component group and the sensing magnet group in FIG. 12 and FIG. 13.

This embodiment provides an imaging lens module 2 that includes a base 20, a frame component 21, a plurality of rollable supporters 22, two movable imaging lens units 23, an optical folding component 25, two sensing magnet groups 26, a flexible printed circuit board 27, two driving coil groups 28 and two hall sensing component groups 29.

The base 20 has a plurality of guide grooves 201 that extend along the same direction.

The frame component 21 is coupled to the base 20 so as to form an accommodation space AS therebetween.

The rollable supporters 22 are located in the accommodation space AS and disposed in the guide grooves 201.

The movable imaging lens units 23 are movably located in the accommodation space AS. Specifically, the movable imaging lens units 23 each include a movable plastic lens barrel 231 and a movable plastic lens element group 232 and has an optical axis OA. The movable plastic lens barrels 231 each have a plurality of guide grooves 2311 that face and correspond to the guide grooves 201 of the base 20. The rollable supporters 22 are sandwiched by the guide grooves 201 and 2311 and are able to roll along an extension direction of the guide grooves 201 and 2311, such that the movable plastic lens barrels 231 are movably supported by the base 20. The movable plastic lens element groups 232 are respectively accommodated in the movable plastic lens barrels 231 and are able to be moved with respect to the base 20 by the movable plastic lens barrels 231. The optical axis OA passes through the movable plastic lens element groups 232, and a direction of the optical axis OA is in parallel with the extension direction of the guide grooves 201 and 2311. Please be noted that each of the movable plastic lens element groups 232 can include one or more lens elements, and the present disclosure is not limited thereto.

The optical folding component 25 is located in the accommodation space AS and disposed at an object side of the movable imaging lens units 23. The optical folding component 25 may be a reflection mirror or a prism that is able to fold an incident optical path 10P from outside into the movable imaging lens units 23 so as to coincide with the optical axis OA.

The sensing magnet groups 26 are located in the accommodation space AS. Specifically, the sensing magnet groups 26 each include a first sensing magnet 261 and a second sensing magnet 262 that are sequentially disposed on one of the movable plastic lens barrels 231 along directions in parallel with the optical axis OA. The sensing magnet groups 26 are respectively located at two opposite sides of the optical axis OA, the first sensing magnet 261 and the second sensing magnet 262 of each sensing magnet group 26 are located at the same side with respect to a reference plane (not shown) that passes through the optical axis OA, and the reference plane has a normal direction perpendicular to the optical axis OA. That is, the optical axis OA is located on the reference plane. When the first sensing magnet 261 and the second sensing magnet 262 of each sensing magnet group 26 are observed from the direction in parallel with the optical axis OA, images of the first sensing magnet 261 and the second sensing magnet 262 of each sensing magnet group 26 are at least partially overlapped. Two adjacent magnetic poles of the first sensing magnet 261 and the second sensing magnet 262 of each sensing magnet group 26 are south poles between which there is a repulsive force.

The flexible printed circuit board 27 is supported by the frame component 21, and the flexible printed circuit board 27 has flexibility.

The driving coil groups 28 are disposed on the flexible printed circuit board 27 along directions in parallel with the optical axis OA. The driving coil groups 28 each include three driving coils 281, 282 and 283 that are opposite to the first sensing magnet 261 and the second sensing magnet 262 of one of the sensing magnet groups 26. The driving coil groups 28 and the sensing magnet groups 26 generate Lorentz forces by electromagnetic interaction therebetween that can be magnetic driving forces for moving the movable plastic lens barrels 231 along a direction in parallel with the optical axis OA. When the movable plastic lens barrels 231 are in their original positions, the first sensing magnets 261 correspond to the driving coils 281, and the second sensing magnets 262 correspond to the driving coils 282 and 283, such that the first sensing magnets 261 and the second sensing magnets 262 can at least partially opposite to the driving coils 281, 282 and 283 after moving the movable plastic lens barrels 231, thereby ensuring sufficient magnetic driving forces can be continuously generated therebetween.

The hall sensing component groups 29 each include three hall sensing components 291, 292 and 293 that are sequentially soldered on the flexible printed circuit board 27 along directions in parallel with the optical axis OA and may be respectively located at central positions of the driving coils 281, 282 and 283, as shown in FIG. 11. When the movable plastic lens barrels 231 are in their original positions, the first sensing magnets 261 correspond to the hall sensing components 291, and the second sensing magnets 262 correspond to the hall sensing components 292 and 293, such that the first sensing magnets 261 and the second sensing magnets 262 can at least partially opposite to the hall sensing components 291, 292 and 293 after moving the movable plastic lens barrels 231, thereby accurately sensing the positions of the first sensing magnet 261 and the second sensing magnet 262, then obtaining the positions of the movable plastic lens barrels 231, and thus calculating the displacements of the movable plastic lens barrels 231.

Specifically, by a proper space configuration, flux density generated by the sensing magnet groups 26 along the direction in parallel with the optical axis OA can be referred to the chart in FIG. 14. As shown in FIG. 14, the flux density changes along the direction in parallel with the optical axis OA according to the positions of the magnetic poles of the first sensing magnets 261 and the second sensing magnets 262, and an output voltage can be generated on the hall sensing component groups 29 from a release point to a working point of the flux density. The hall sensing component groups 29 can obtain the high potential H and the low potential L of the output voltage to deduce the position of each magnetic pole of the sensing magnet groups 26, thereby timely obtaining the positions of the movable plastic lens barrels 231. Note that the proper space configuration will be achieved by the following conditions.

When a shortest distance along the direction in parallel with the optical axis OA between two magnetic south poles among the first sensing magnet 261 and the second sensing magnet 262 of each of the of the sensing magnet groups 26 is Dp, a longest distance along the direction in parallel with the optical axis OA between two magnetic poles among the first sensing magnet 261 and the second sensing magnet 262 of each of the of the sensing magnet groups 26 is Dm, and the total quantity of the sensing magnets of each of the of the sensing magnet groups 26 is Nt, the following conditions are satisfied: Dp=1.53 [mm]; Dm=5.03 [mm]; Nt=2; and Nt×Dp/(Dm−(Nt−1)×Dp)=0.87.

When the shortest distance along the direction in parallel with the optical axis OA between two magnetic south poles among the first sensing magnet 261 and the second sensing magnet 262 of each of the of the sensing magnet groups 26 is Dp, and the longest distance along the direction in parallel with the optical axis OA between two magnetic poles among the first sensing magnet 261 and the second sensing magnet 262 of each of the of the sensing magnet groups 26 is Dm, the following condition is satisfied: Dp/Dm=0.30.

When the shortest distance along the direction in parallel with the optical axis OA between two magnetic south poles among the first sensing magnet 261 and the second sensing magnet 262 of each of the of the sensing magnet groups 26 is Dp, and a shortest distance along the direction in parallel with the optical axis OA between the hall sensing components 291, 292 and 293 of each of the hall sensing component groups 29 is Dh, the following condition is satisfied: Dh=1.40 [mm]; and Dh/Dp=0.92.

3rd Embodiment

Figure 15:
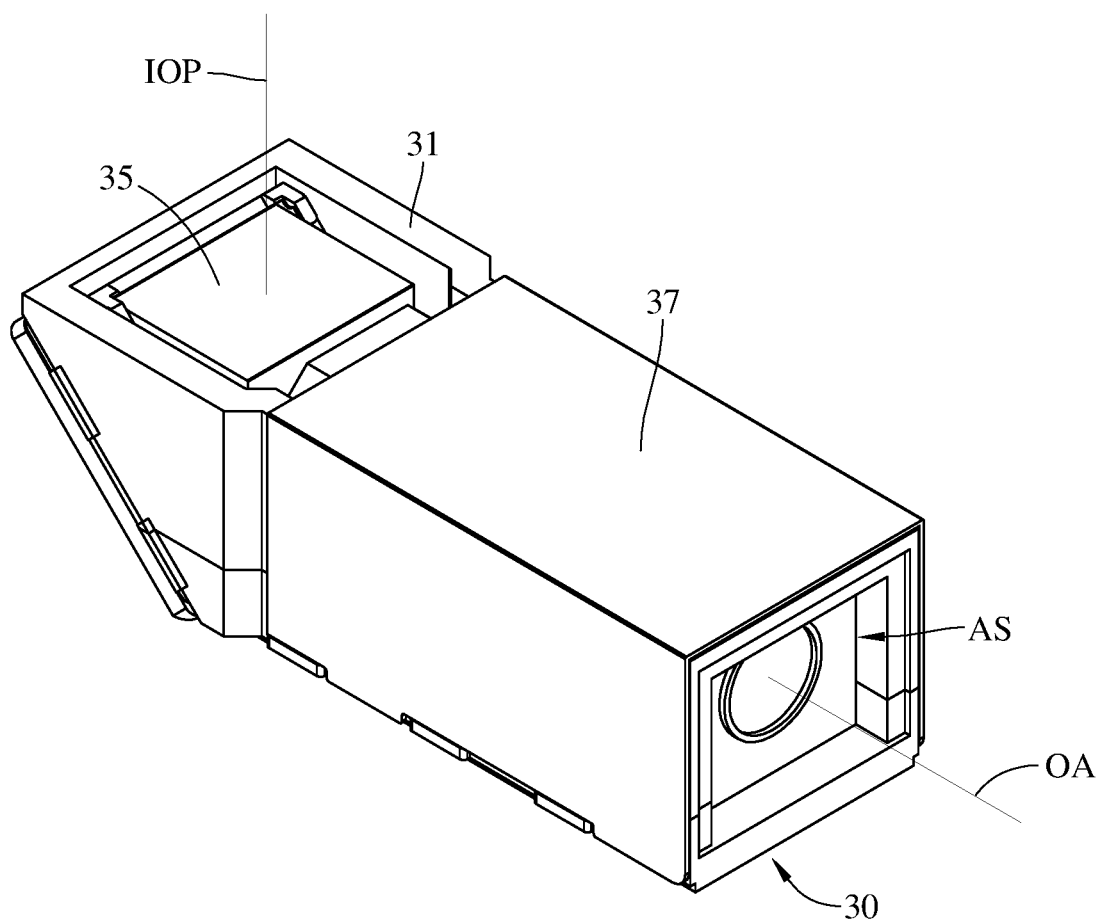
FIG. 15 is a perspective view of the imaging lens module according to the 3rd embodiment of the present disclosure.
Figure 16:
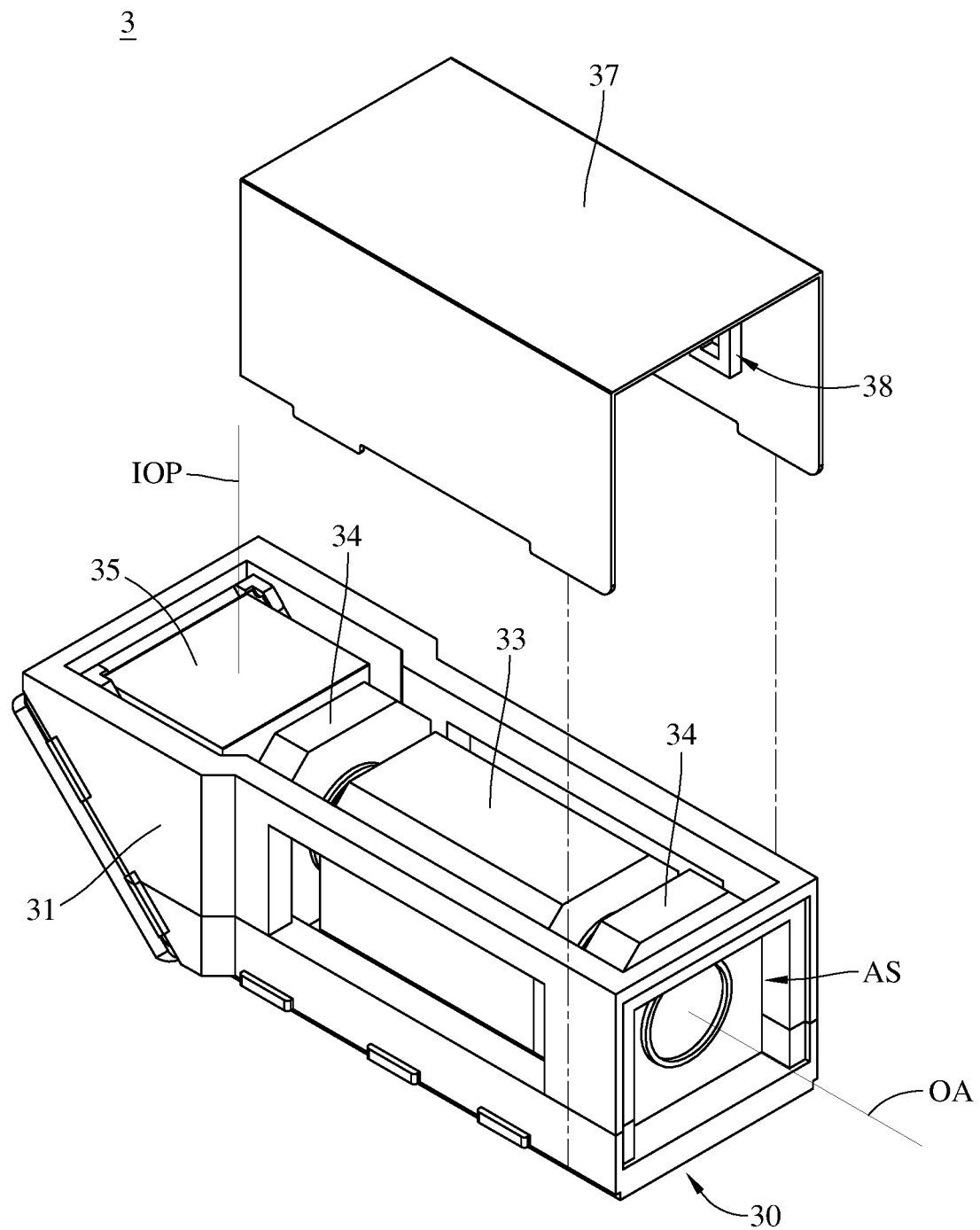
FIG. 16 is a partially exploded view of the imaging lens module in FIG. 15.
Figure 17:
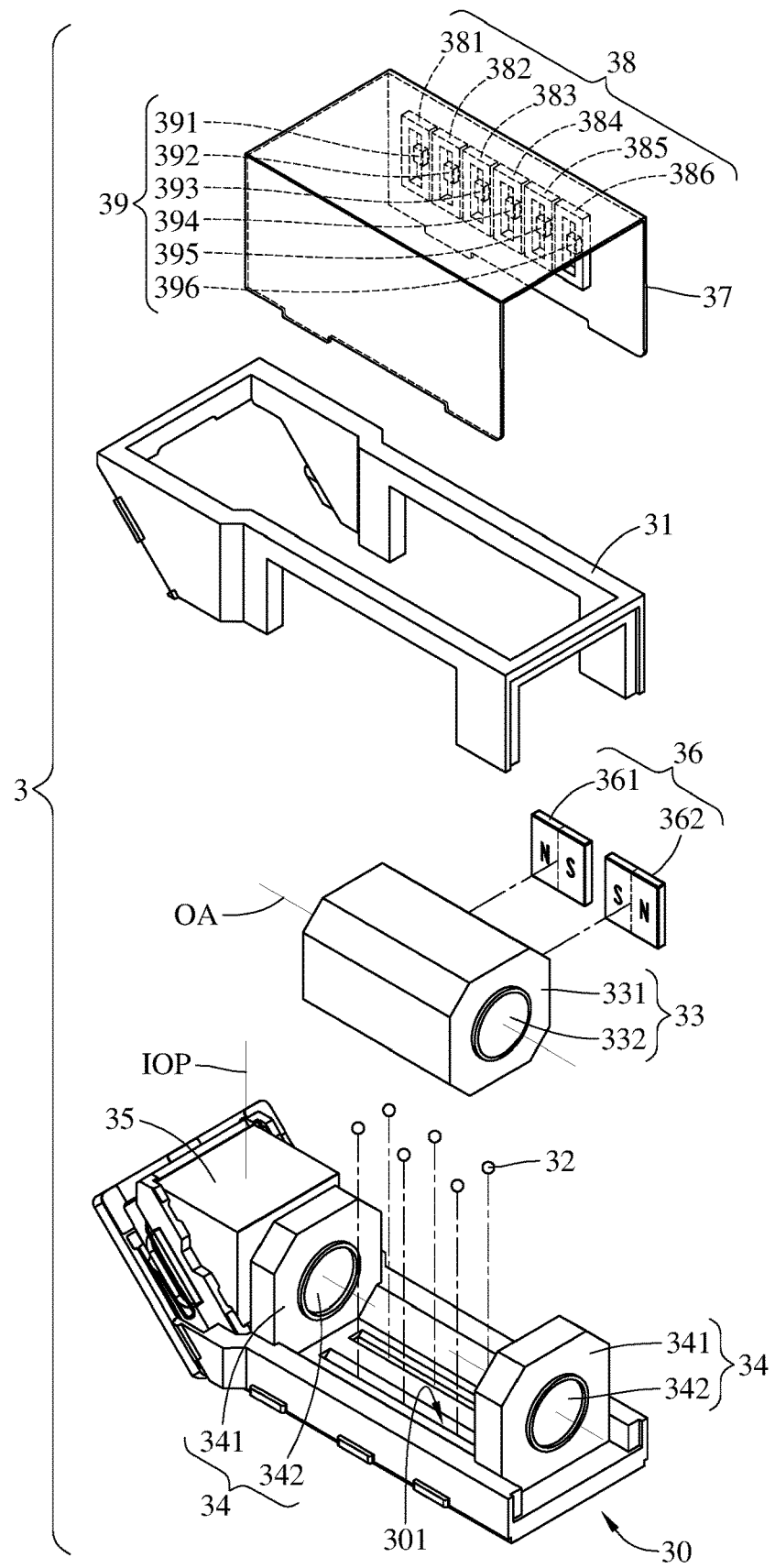
FIG. 17 is an exploded view of the imaging lens module in FIG. 15.
Figure 18:
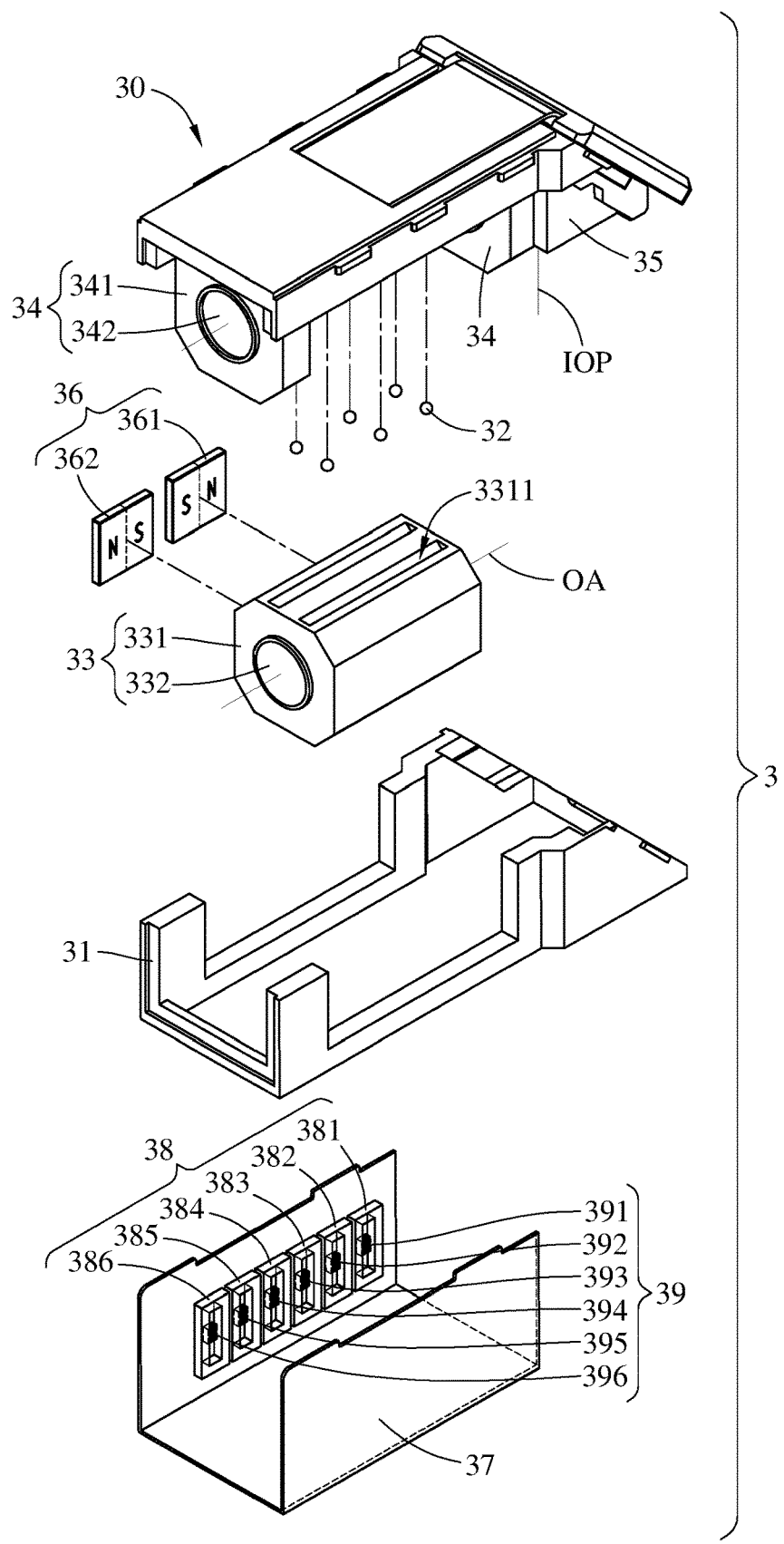
FIG. 18 is another exploded view of the imaging lens module in FIG. 15.
Figure 19:
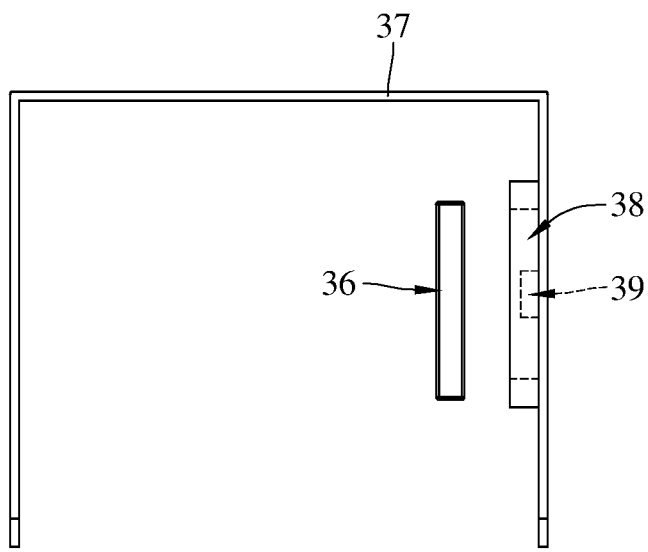
FIG. 19 is a front view showing the configuration of a flexible printed circuit board, a driving coil group, a hall sensing component group and a sensing magnet group of the imaging lens module in FIG. 15.
Figure 20:
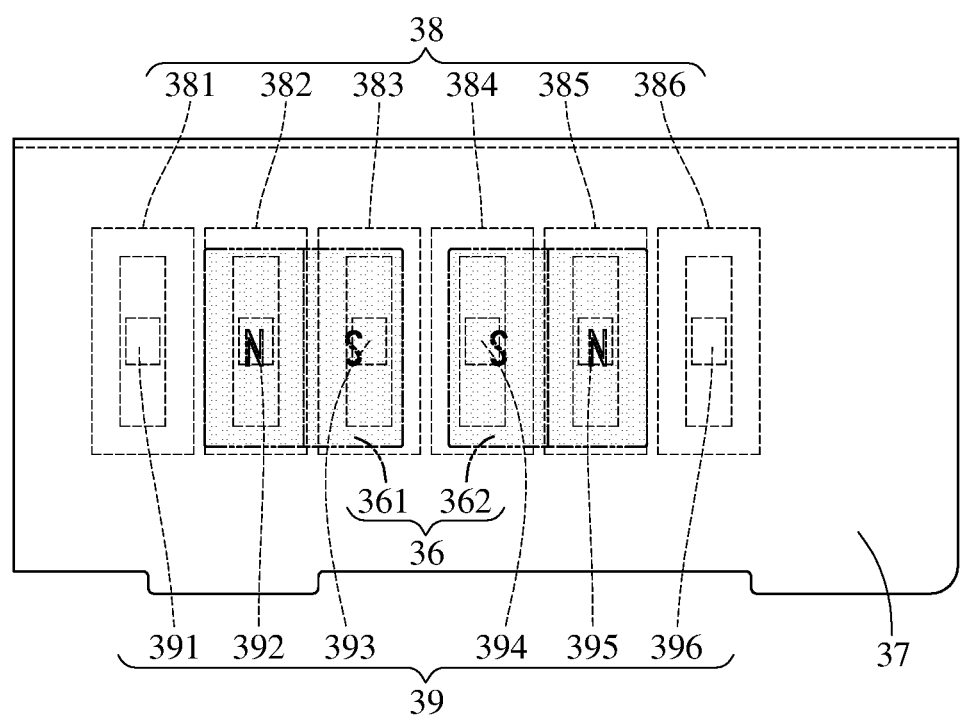
FIG. 20 is a side view showing the configuration of the flexible printed circuit board, the driving coil group, the hall sensing component group and the sensing magnet group of the imaging lens module in FIG. 15.
Figure 21:
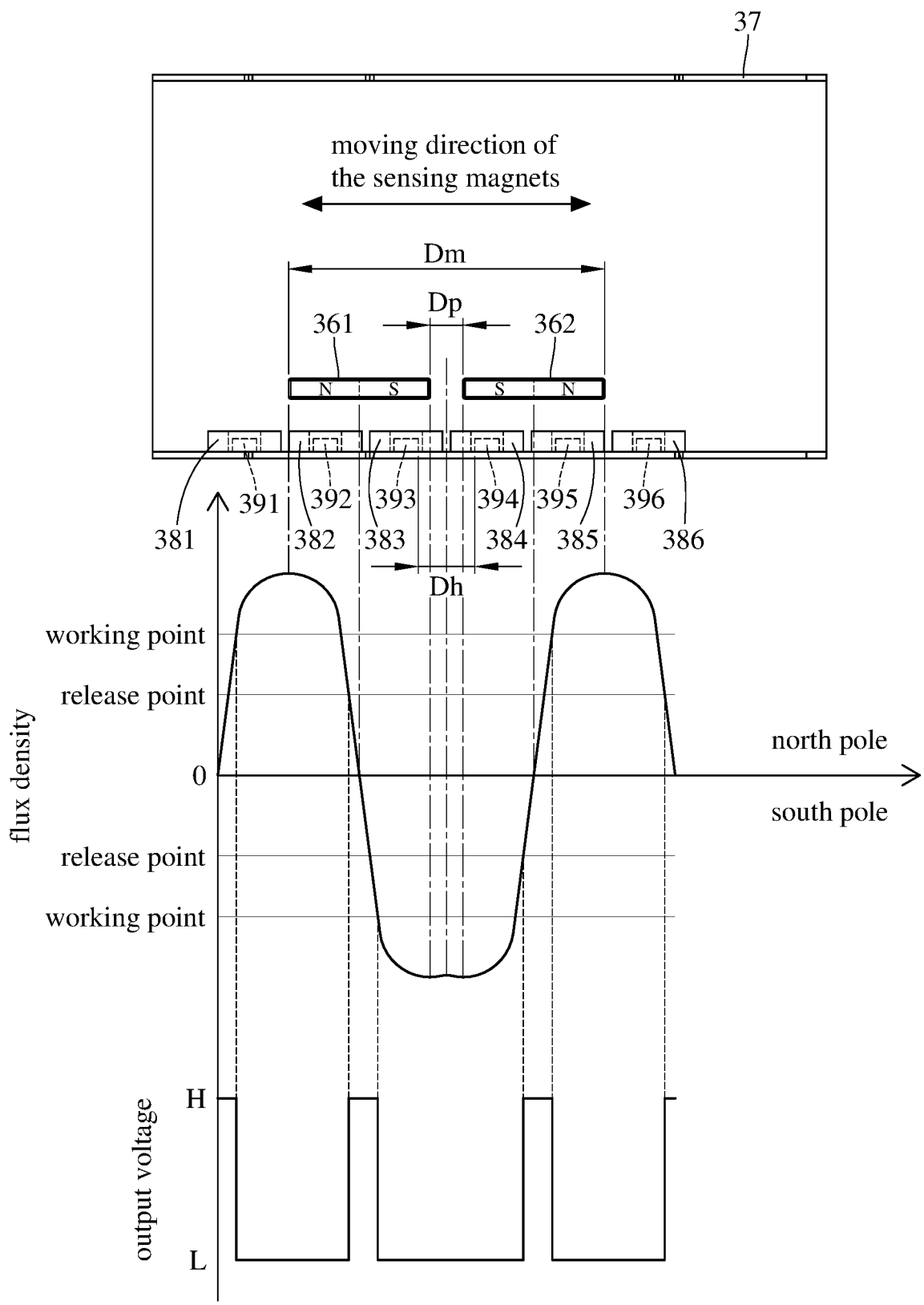
FIG. 21 is a chart showing flux density and output voltage corresponding to the configuration of the driving coil group, the hall sensing component group and the sensing magnet group in FIG. 19 and FIG. 20.

Please refer to FIG. 15 to FIG. 21, where FIG. 15 is a perspective view of the imaging lens module according to the 3rd embodiment of the present disclosure, FIG. 16 is a partially exploded view of the imaging lens module in FIG. 15, FIG. 17 is an exploded view of the imaging lens module in FIG. 15, FIG. 18 is another exploded view of the imaging lens module in FIG. 15, FIG. 19 is a front view showing the configuration of a flexible printed circuit board, a driving coil group, a hall sensing component group and a sensing magnet group of the imaging lens module in FIG. 15, FIG. 20 is a side view showing the configuration of the flexible printed circuit board, the driving coil group, the hall sensing component group and the sensing magnet group of the imaging lens module in FIG. 15, and FIG. 21 is a chart showing flux density and output voltage corresponding to the configuration of the driving coil group, the hall sensing component group and the sensing magnet group in FIG. 19 and FIG. 20.

This embodiment provides an imaging lens module 3 that includes a base 30, a frame component 31, a plurality of rollable supporters 32, a movable imaging lens unit 33, two fixed imaging lens units 34, an optical folding component 35, a sensing magnet group 36, a flexible printed circuit board 37, a driving coil group 38 and a hall sensing component group 39.

The base 30 has a plurality of guide grooves 301 that extend along the same direction.

The frame component 31 is coupled to the base 30 so as to form an accommodation space AS therebetween.

The rollable supporters 32 are located in the accommodation space AS and disposed in the guide grooves 301.

The movable imaging lens unit 33 is movably located in the accommodation space AS. Specifically, the movable imaging lens unit 33 includes a movable plastic lens barrel 331 and a movable plastic lens element group 332 and has an optical axis OA. The movable plastic lens barrel 331 has a plurality of guide grooves 3311 that face and correspond to the guide grooves 301 of the base 30. The rollable supporters 32 are sandwiched by the guide grooves 301 and 3311 and are able to roll along an extension direction of the guide grooves 301 and 3311, such that the movable plastic lens barrel 331 is movably supported by the base 30. The movable plastic lens element group 332 is accommodated in the movable plastic lens barrel 331 and is able to be moved with respect to the base 30 by the movable plastic lens barrel 331. The optical axis OA passes through the movable plastic lens element group 332, and a direction of the optical axis OA is in parallel with the extension direction of the guide grooves 301 and 3311.

The fixed imaging lens units 34 are immovably located in the accommodation space AS and respectively disposed at an object side and an image-side of the movable imaging lens unit 33. The fixed imaging lens units 34 each include a fixed plastic lens barrel 341 and a fixed plastic lens element group 342 that is accommodated in the fixed plastic lens barrel 341. Please be noted that each of the movable plastic lens element group 332 and the fixed plastic lens element groups 342 can include one or more lens elements, and the present disclosure is not limited thereto.

The optical folding component 35 is located in the accommodation space AS and disposed at an object side of the movable imaging lens unit 33 and the fixed imaging lens units 34. The optical folding component 35 may be a reflection mirror or a prism that is able to fold an incident optical path 10P from outside into the fixed imaging lens units 34 and the movable imaging lens unit 33 so as to coincide with the optical axis OA.

The sensing magnet group 36 is located in the accommodation space AS. Specifically, the sensing magnet group 36 includes a first sensing magnet 361 and a second sensing magnet 362 that are sequentially disposed on the movable plastic lens barrel 331 along a direction in parallel with the optical axis OA. The first sensing magnet 361 and the second sensing magnet 362 are located at the same side with respect to a reference plane (not shown) that passes through the optical axis OA, and the reference plane has a normal direction perpendicular to the optical axis OA. That is, the optical axis OA is located on the reference plane. When the first sensing magnet 361 and the second sensing magnet 362 are observed from the direction in parallel with the optical axis OA, images of the first sensing magnet 361 and the second sensing magnet 362 are at least partially overlapped. Two adjacent magnetic poles of the first sensing magnet 361 and the second sensing magnet 362 are south poles between which there is a repulsive force.

The flexible printed circuit board 37 is supported by the frame component 31, and the flexible printed circuit board 37 has flexibility.

The driving coil group 38 is disposed on the flexible printed circuit board 37 along a direction in parallel with the optical axis OA. The driving coil group 38 includes six driving coils 381, 382, 383, 384, 385 and 386 that are opposite to the first sensing magnet 361 and the second sensing magnet 362 of the sensing magnet group 36. The driving coil group 38 and the sensing magnet group 36 generate a Lorentz force by electromagnetic interaction therebetween that can be a magnetic driving force for moving the movable plastic lens barrel 331 along a direction in parallel with the optical axis OA. When the movable plastic lens barrel 331 is in its original position, the first sensing magnet 361 corresponds to three driving coils 381, 382 and 383, and the second sensing magnet 362 corresponds to another three driving coils 384, 385 and 386, such that the first sensing magnet 361 and the second sensing magnet 362 can at least partially opposite to the driving coils 381, 382, 383, 384, 385 and 386 after moving the movable plastic lens barrel 331, thereby ensuring a sufficient magnetic driving force can be continuously generated therebetween.

The hall sensing component group 39 includes six hall sensing components 391, 392, 393, 394, 395 and 396 that are sequentially soldered on the flexible printed circuit board 37 along a direction in parallel with the optical axis OA and may be respectively located at central positions of the driving coils 381, 382, 383, 384, 385 and 386, as shown in FIG. 18. When the movable plastic lens barrel 331 is in its original position, the first sensing magnet 361 corresponds to three hall sensing components 391, 392 and 393, and the second sensing magnet 362 corresponds to another three hall sensing components 394, 395 and 396, such that the first sensing magnet 361 and the second sensing magnet 362 can at least partially opposite to the hall sensing components 391, 392, 393, 394, 395 and 396 after moving the movable plastic lens barrel 331, thereby accurately sensing the positions of the first sensing magnet 361 and the second sensing magnet 362, then obtaining the position of the movable plastic lens barrel 331, and thus calculating the displacement of the movable plastic lens barrel 331.

Specifically, by a proper space configuration, flux density generated by the sensing magnet group 36 along the direction in parallel with the optical axis OA can be referred to the chart in FIG. 21. As shown in FIG. 21, the flux density changes along the direction in parallel with the optical axis OA according to the positions of the magnetic poles of the first sensing magnet 361 and the second sensing magnet 362, and an output voltage can be generated on the hall sensing component group 39 from a release point to a working point of the flux density. The hall sensing component group 39 can obtain the high potential H and the low potential L of the output voltage to deduce the position of each magnetic pole of the sensing magnet group 36, thereby timely obtaining the position of the movable plastic lens barrel 331. Note that the proper space configuration will be achieved by the following conditions.

When a shortest distance along the direction in parallel with the optical axis OA between two magnetic south poles among the first sensing magnet 361 and the second sensing magnet 362 is Dp, a longest distance along the direction in parallel with the optical axis OA between two magnetic poles among the first sensing magnet 361 and the second sensing magnet 362 is Dm, and the total quantity of the sensing magnets of the sensing magnet group 36 is Nt, the following conditions are satisfied: $Dp=0.82$ [mm]; $Dm=7.82$ [mm]; $Nt=2$; and $Nt \times Dp/(Dm-(Nt-1) \times Dp)=0.23$.

When the shortest distance along the direction in parallel with the optical axis OA between two magnetic south poles among the first sensing magnet 361 and the second sensing magnet 362 is Dp, and the longest distance along the direction in parallel with the optical axis OA between two magnetic poles among the first sensing magnet 361 and the second sensing magnet 362 is Dm, the following condition is satisfied: $Dp/Dm=0.10$.

When the shortest distance along the direction in parallel with the optical axis OA between two magnetic south poles among the first sensing magnet 361 and the second sensing magnet 362 is Dp, and a shortest distance along the direction in parallel with the optical axis OA between the hall sensing components 391, 392, 393, 394, 395 and 396 is Dh, the following condition is satisfied: $Dh=1.40$ [mm]; and $Dh/Dp=1.71$.

4th Embodiment

Figure 22:
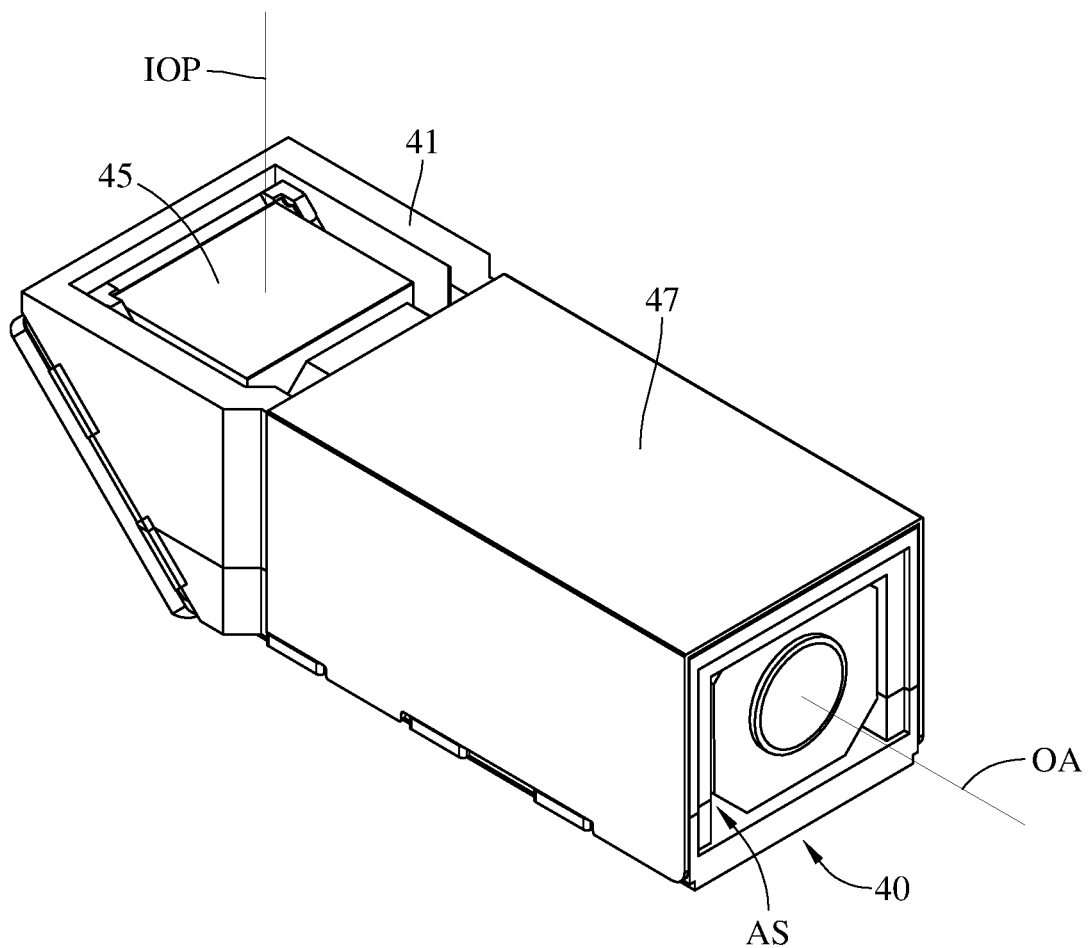
FIG. 22 is a perspective view of the imaging lens module according to the 4th embodiment of the present disclosure.
Figure 23:
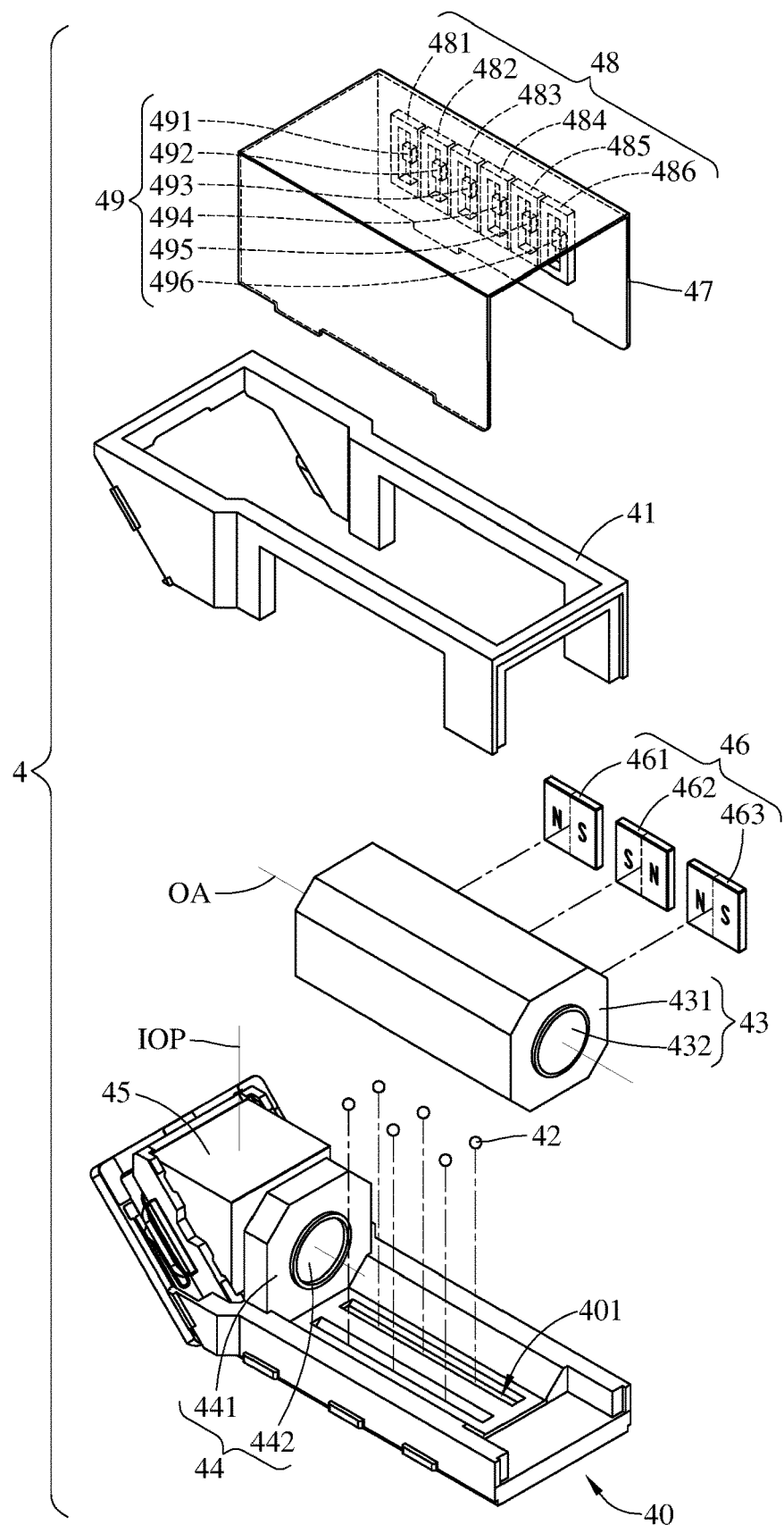
FIG. 23 is an exploded view of the imaging lens module in FIG. 22.
Figure 24:
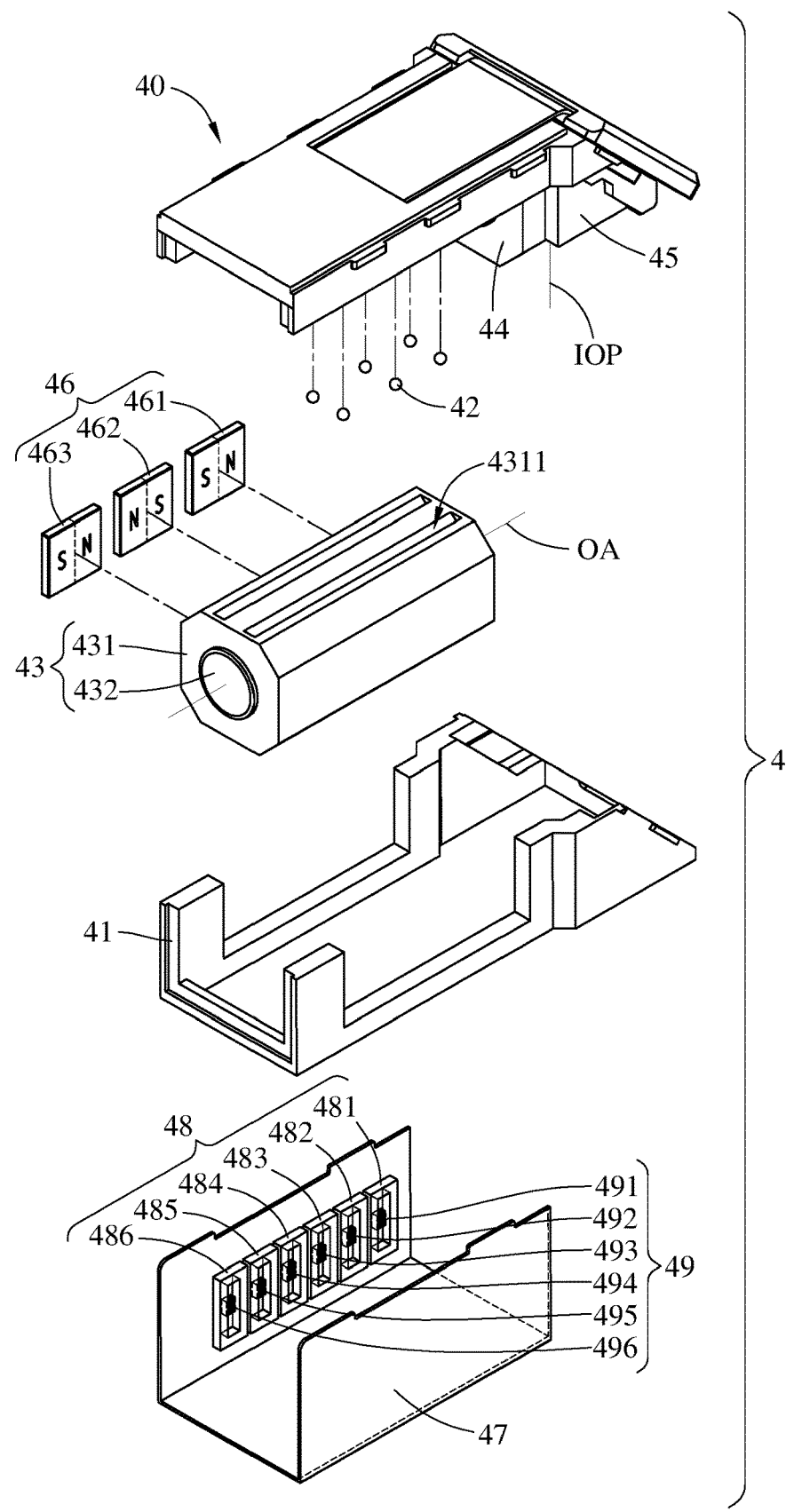
FIG. 24 is another exploded view of the imaging lens module in FIG. 22.
Figure 25:
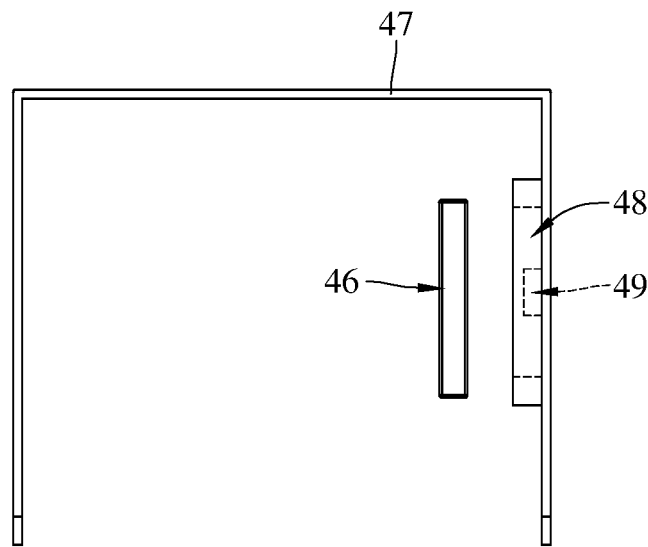
FIG. 25 is a front view showing the configuration of a flexible printed circuit board, a driving coil group, a hall sensing component group and a sensing magnet group of the imaging lens module in FIG. 22.
Figure 26:
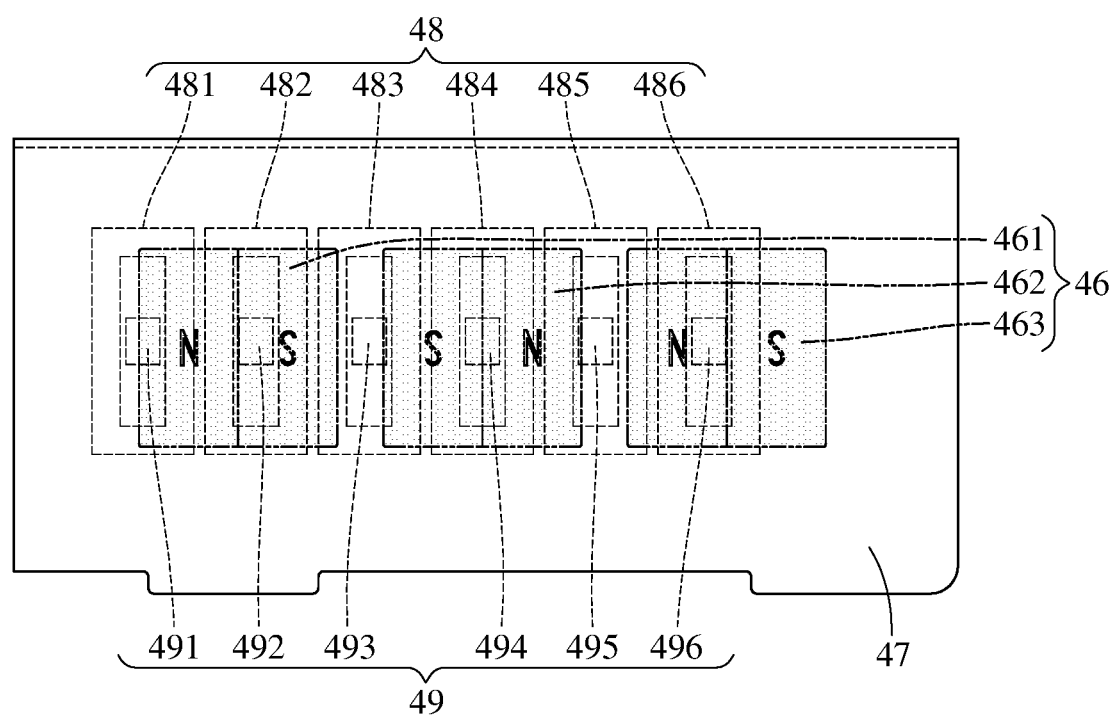
FIG. 26 is a side view showing the configuration of the flexible printed circuit board, the driving coil group, the hall sensing component group and the sensing magnet group of the imaging lens module in FIG. 22.
Figure 27:
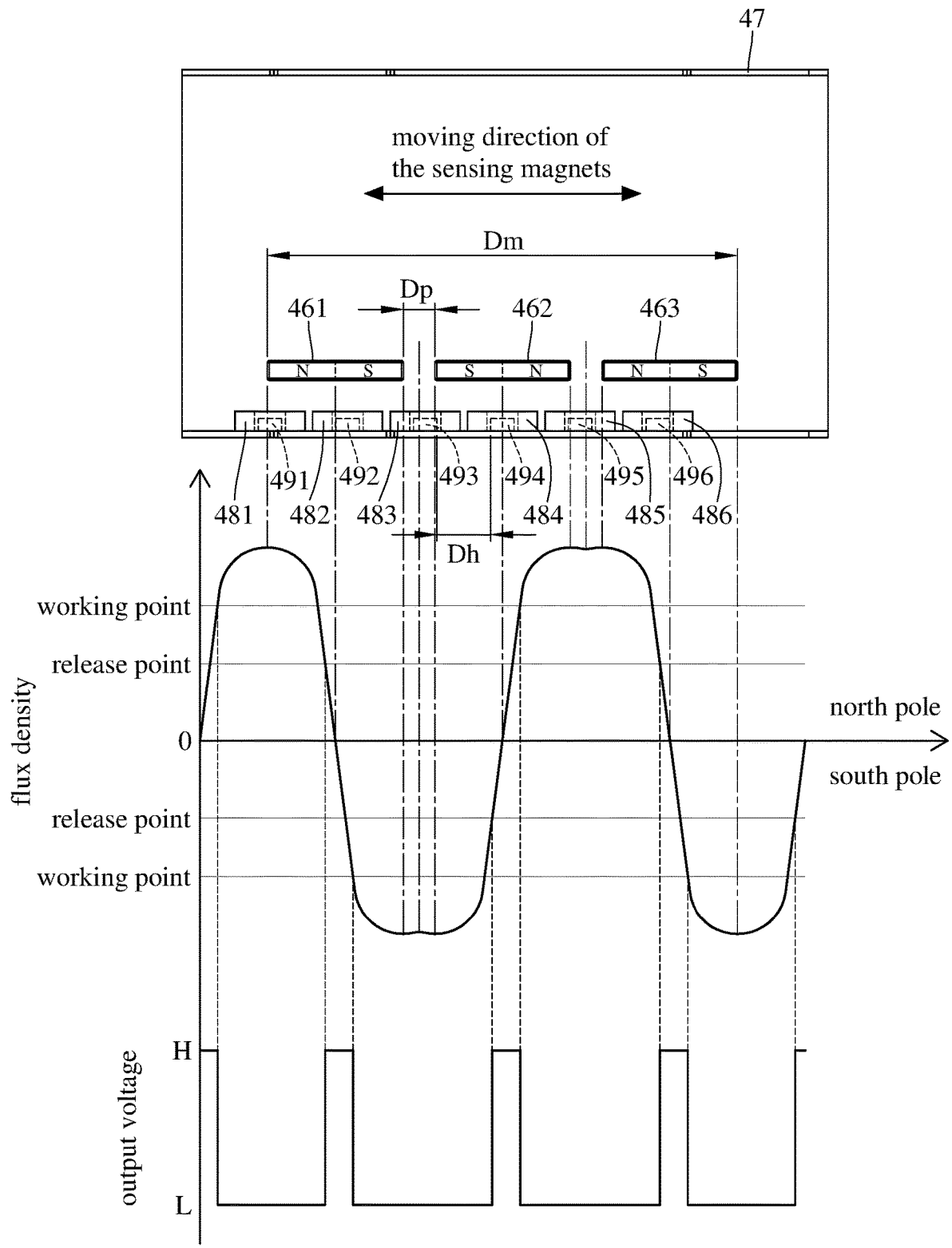
FIG. 27 is a chart showing flux density and output voltage corresponding to the configuration of the driving coil group, the hall sensing component group and the sensing magnet group in FIG. 25 and FIG. 26.

Please refer to FIG. 22 to FIG. 27, where FIG. 22 is a perspective view of the imaging lens module according to the 4th embodiment of the present disclosure, FIG. 23 is an exploded view of the imaging lens module in FIG. 22, FIG. 24 is another exploded view of the imaging lens module in FIG. 22, FIG. 25 is a front view showing the configuration of a flexible printed circuit board, a driving coil group, a hall sensing component group and a sensing magnet group of the imaging lens module in FIG. 22, FIG. 26 is a side view showing the configuration of the flexible printed circuit board, the driving coil group, the hall sensing component group and the sensing magnet group of the imaging lens module in FIG. 22, and FIG. 27 is a chart showing flux density and output voltage corresponding to the configuration of the driving coil group, the hall sensing component group and the sensing magnet group in FIG. 25 and FIG. 26.

This embodiment provides an imaging lens module 4 that includes a base 40, a frame component 41, a plurality of rollable supporters 42, a movable imaging lens unit 43, a fixed imaging lens unit 44, an optical folding component 45, a sensing magnet group 46, a flexible printed circuit board 47, a driving coil group 48 and a hall sensing component group 49.

The base 40 has a plurality of guide grooves 401 that extend along the same direction.

The frame component 41 is coupled to the base 40 so as to form an accommodation space AS therebetween.

The rollable supporters 42 are located in the accommodation space AS and disposed in the guide grooves 401.

The movable imaging lens unit 43 is movably located in the accommodation space AS. Specifically, the movable imaging lens unit 43 includes a movable plastic lens barrel 431 and a movable plastic lens element group 432 and has an optical axis OA. The movable plastic lens barrel 431 has a plurality of guide grooves 4311 that face and correspond to the guide grooves 401 of the base 40. The rollable supporters 42 are sandwiched by the guide grooves 401 and 4311 and are able to roll along an extension direction of the guide grooves 401 and 4311, such that the movable plastic lens barrel 431 is movably supported by the base 40. The movable plastic lens element group 432 is accommodated in the movable plastic lens barrel 431 and is able to be moved with respect to the base 40 by the movable plastic lens barrel 431. The optical axis OA passes through the movable plastic lens element group 432, and a direction of the optical axis OA is in parallel with the extension direction of the guide grooves 401 and 4311.

The fixed imaging lens unit 44 is immovably located in the accommodation space AS and disposed at an object side of the movable imaging lens unit 43. The fixed imaging lens unit 44 includes a fixed plastic lens barrel 441 and a fixed plastic lens element group 442 that is accommodated in the fixed plastic lens barrel 441. Please be noted that each of the movable plastic lens element group 432 and the fixed plastic lens element group 442 can include one or more lens elements, and the present disclosure is not limited thereto.

The optical folding component 45 is located in the accommodation space AS and disposed at an object side of the fixed imaging lens unit 44. The optical folding component 45 may be a reflection mirror or a prism that is able to fold an incident optical path 10P from outside into the fixed imaging lens unit 44 and the movable imaging lens unit 43 so as to coincide with the optical axis OA.

The sensing magnet group 46 is located in the accommodation space AS. Specifically, the sensing magnet group 46 includes a first sensing magnet 461, a second sensing magnet 462 and a third sensing magnet 463 that are sequentially disposed on the movable plastic lens barrel 431 along a direction in parallel with the optical axis OA. The first sensing magnet 461, the second sensing magnet 462 and the third sensing magnet 463 are located at the same side with respect to a reference plane (not shown) that passes through the optical axis OA, and the reference plane has a normal direction perpendicular to the optical axis OA. That is, the optical axis OA is located on the reference plane. When the first sensing magnet 461, the second sensing magnet 462 and the third sensing magnet 463 are observed from the direction in parallel with the optical axis OA, images of the first sensing magnet 461, the second sensing magnet 462 and the third sensing magnet 463 are at least partially overlapped. Two adjacent magnetic poles of the first sensing magnet 461 and the second sensing magnet 462 are south poles between which there is a repulsive force. Two adjacent magnetic poles of the second sensing magnet 462 and the third sensing magnet 463 are north poles between which there is a repulsive force.

The flexible printed circuit board 47 is supported by the frame component 41, and the flexible printed circuit board 47 has flexibility.

The driving coil group 48 is disposed on the flexible printed circuit board 47 along a direction in parallel with the optical axis OA. The driving coil group 48 includes six driving coils 481, 482, 483, 484, 485 and 486 that are opposite to the first sensing magnet 461, the second sensing magnet 462 and the third sensing magnet 463 of the sensing magnet group 46. The driving coil group 48 and the sensing magnet group 46 generate a Lorentz force by electromagnetic interaction therebetween that can be a magnetic driving force for moving the movable plastic lens barrel 431 along a direction in parallel with the optical axis OA. When the movable plastic lens barrel 431 is in its original position, the first sensing magnet 461 corresponds to three driving coils 481, 482 and 483, the second sensing magnet 462 corresponds to three driving coils 483, 484 and 485, and the third sensing magnet 463 corresponds to two driving coils 485 and 486, such that the first sensing magnet 461, the second sensing magnet 462 and the third sensing magnet 463 can at least partially opposite to the driving coils 481, 482, 483, 484, 485 and 486 after moving the movable plastic lens barrel 431, thereby ensuring a sufficient magnetic driving force can be continuously generated therebetween.

The hall sensing component group 49 includes six hall sensing components 491, 492, 493, 494, 495 and 496 that are sequentially soldered on the flexible printed circuit board 47 along a direction in parallel with the optical axis OA and may be respectively located at central positions of the driving coils 481, 482, 483, 484, 485 and 486, as shown in FIG. 24. When the movable plastic lens barrel 431 is in its original position, the first sensing magnet 461 corresponds to two hall sensing components 491 and 492, the second sensing magnet 462 corresponds to three hall sensing components 493, 494 and 495, and the third sensing magnet 463 corresponds to the other one hall sensing component 496, such that the first sensing magnet 461, the second sensing magnet 462 and the third sensing magnet 463 can at least partially opposite to the hall sensing components 491, 492, 493, 494, 495 and 496 after moving the movable plastic lens barrel 431, thereby accurately sensing the positions of the first sensing magnet 461, the second sensing magnet 462 and the third sensing magnet 463, then obtaining the position of the movable plastic lens barrel 431, and thus calculating the displacement of the movable plastic lens barrel 431.

Specifically, by a proper space configuration, flux density generated by the sensing magnet group 46 along the direction in parallel with the optical axis OA can be referred to the chart in FIG. 27. As shown in FIG. 27, the flux density changes along the direction in parallel with the optical axis OA according to the positions of the magnetic poles of the first sensing magnet 461, the second sensing magnet 462 and the third sensing magnet 463, and an output voltage can be generated on the hall sensing component group 49 from a release point to a working point of the flux density. The hall sensing component group 49 can obtain the high potential H and the low potential L of the output voltage to deduce the position of each magnetic pole of the sensing magnet group 46, thereby timely obtaining the position of the movable plastic lens barrel 431. Note that the proper space configuration will be achieved by the following conditions.

When a shortest distance along the direction in parallel with the optical axis OA between two magnetic south poles or two magnetic north poles among the first sensing magnet 461, the second sensing magnet 462 and the third sensing magnet 463 is Dp, a longest distance along the direction in parallel with the optical axis OA between two magnetic poles among the first sensing magnet 461, the second sensing magnet 462 and the third sensing magnet 463 is Dm, and the total quantity of the sensing magnets of the sensing magnet group 46 is Nt, the following conditions are satisfied: Dp=0.82 [mm]; Dm=12.13 [mm]; Nt=2; and Nt×Dp/(Dm−(Nt−1)×Dp)=0.23.

When the shortest distance along the direction in parallel with the optical axis OA between two magnetic south poles or two magnetic north poles among the first sensing magnet 461, the second sensing magnet 462 and the third sensing magnet 463 is Dp, and the longest distance along the direction in parallel with the optical axis OA between two magnetic poles among the first sensing magnet 461, the second sensing magnet 462 and the third sensing magnet 463 is Dm, the following condition is satisfied: Dp/Dm=0.07.

When the shortest distance along the direction in parallel with the optical axis OA between two magnetic south poles or two magnetic north poles among the first sensing magnet 461, the second sensing magnet 462 and the third sensing magnet 463 is Dp, and a shortest distance along the direction in parallel with the optical axis OA between the hall sensing components 491, 492, 493, 494, 495 and 496 is Dh, the following condition is satisfied: Dh=1.40 [mm]; and Dh/Dp=1.71.

5th Embodiment

Figure 28:
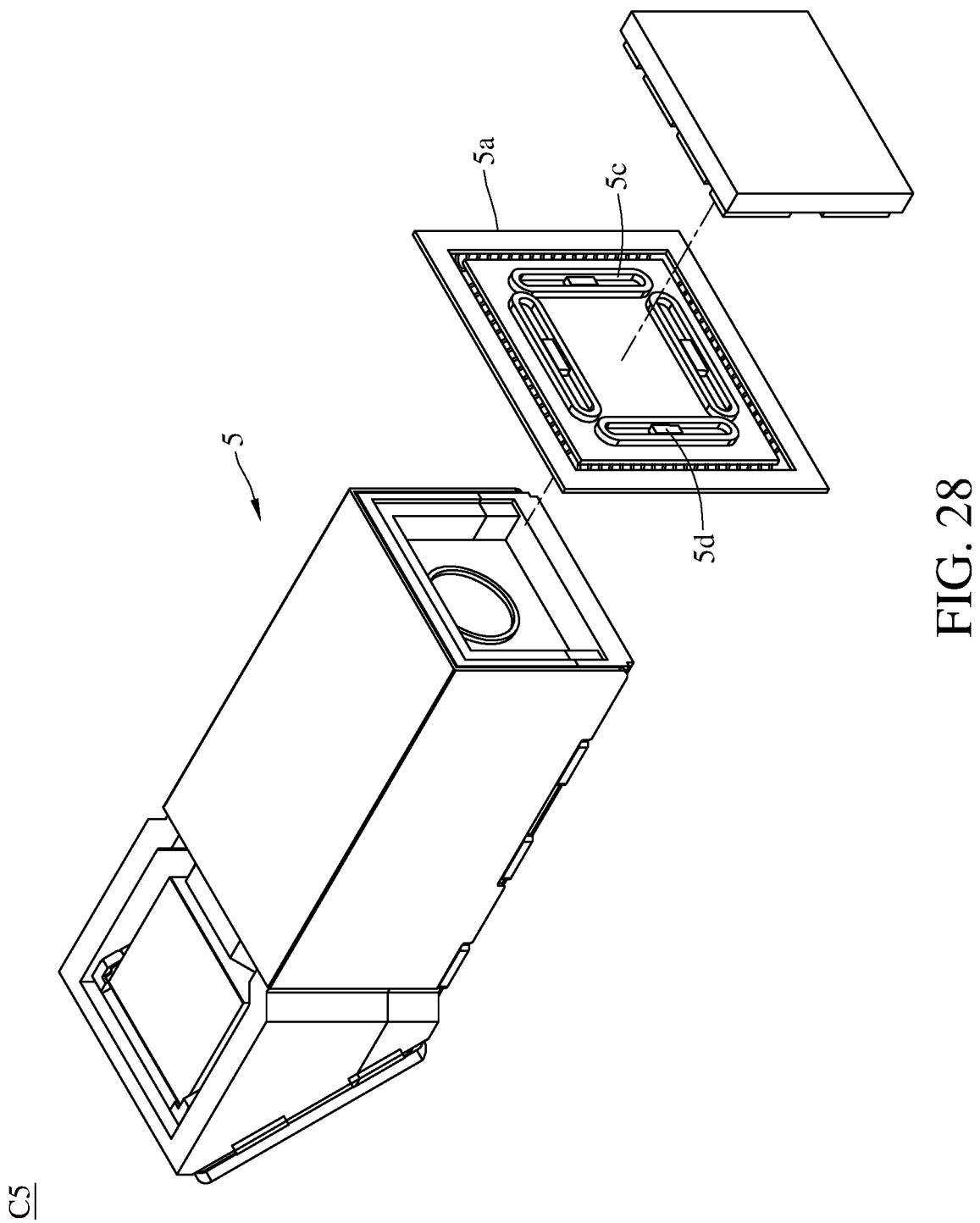
FIG. 28 is an exploded view of a camera module according to the 5th embodiment of the present disclosure.
Figure 29:
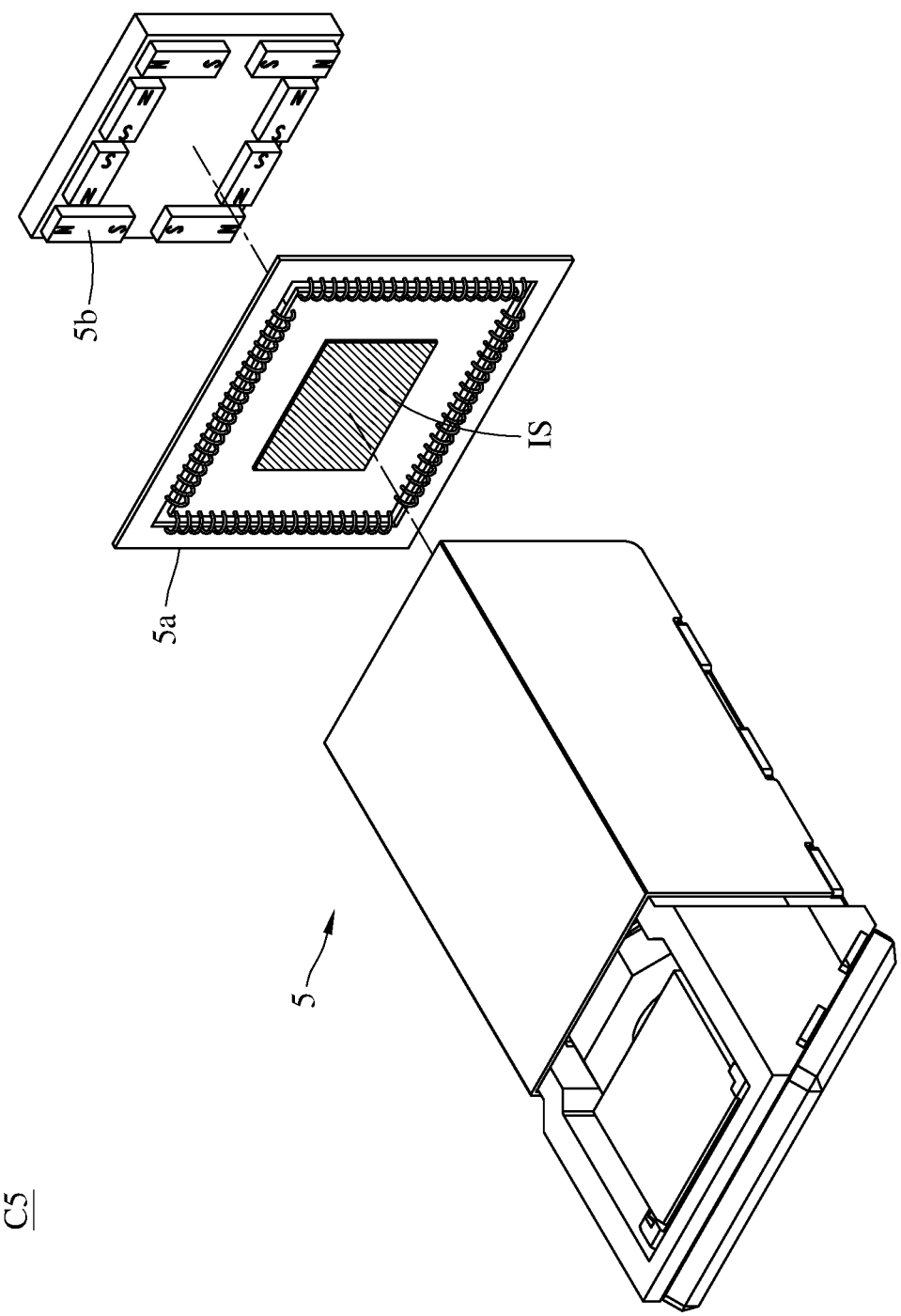
FIG. 29 is another exploded view of the camera module in FIG. 28.

Please refer to FIG. 28 to FIG. 29, where FIG. 28 is an exploded view of a camera module according to the 5th embodiment of the present disclosure, and FIG. 29 is another exploded view of the camera module in FIG. 28.

This embodiment provides a camera module C5 that includes an imaging lens module 5 and an image sensor IS. The imaging lens module 5 may be similar to the imaging lens module 3 of the 3rd embodiment, and only differences between this and the above-mentioned embodiments will be described hereinafter. In addition, the camera module C5 may also include the imaging lens module of other embodiment, and the present disclosure is not limited thereto.

The imaging lens module 5 has an image surface (not shown), and the image surface IS is disposed on the image surface of the imaging lens module 5 so as to convert light passing through the imaging lens module 5 into an optical image signal.

The imaging lens module 5 further includes an optical image stabilizer 5a, an auxiliary sensing magnet group 5b, an auxiliary driving coil group 5c and an auxiliary hall sensing component group 5d. The optical image stabilizer 5a is disposed on the image sensor IS and is able to move the image sensor IS so as to stabilize the converted optical image signal on the image sensor IS. The auxiliary sensing magnet group 5b, the auxiliary driving coil group 5c and the auxiliary hall sensing component group 5d are disposed on the optical image stabilizer 5a to collaborate with one another to move the optical image stabilizer 5a, such that the image sensor IS is in a condition that can be driven so as to achieve an optical image stabilization function.

6th Embodiment

Figure 30:
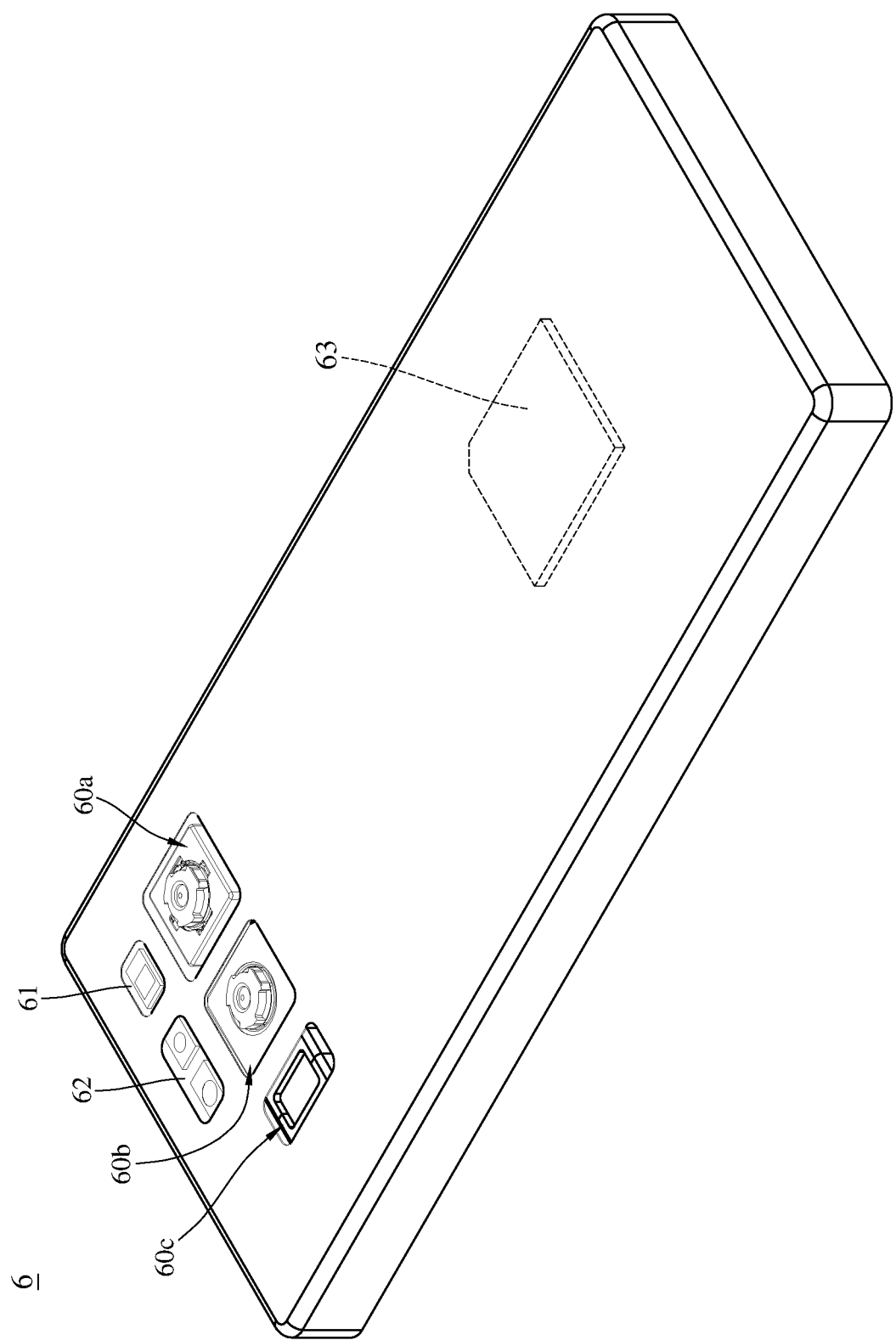
FIG. 30 is a perspective view of an electronic device according to the 6th embodiment of the present disclosure.
Figure 31:
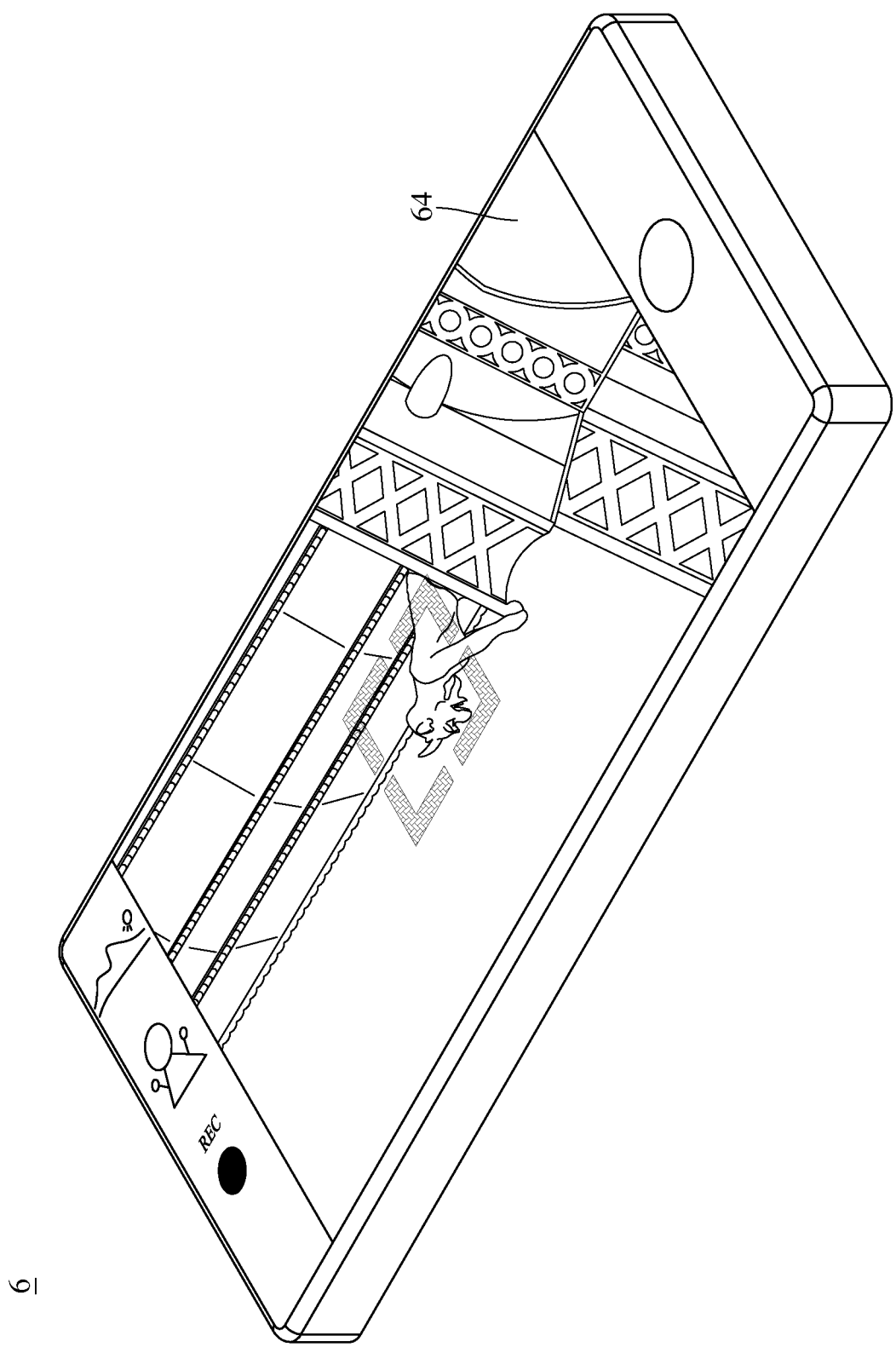
FIG. 31 is another perspective view of the electronic device in FIG. 30.

Please refer to FIG. 30 and FIG. 31, wherein FIG. 30 is a perspective view of an electronic device according to the 6th embodiment of the present disclosure, and FIG. 31 is another perspective view of the electronic device in FIG. 30.

In this embodiment, an electronic device 6 is a smartphone including a plurality of camera modules, a flash module 61, a focus assist module 62, an image signal processor 63, a display module (user interface) 64 and an image software processor (not shown).

The camera modules include an ultra-wide-angle camera module 60a, a high pixel camera module 60b and a telephoto camera module 60c. The camera module C5 disclosed in the 5th embodiment is taken as the telephoto camera module 60c, but the present disclosure is not limited thereto.

Figure 32:
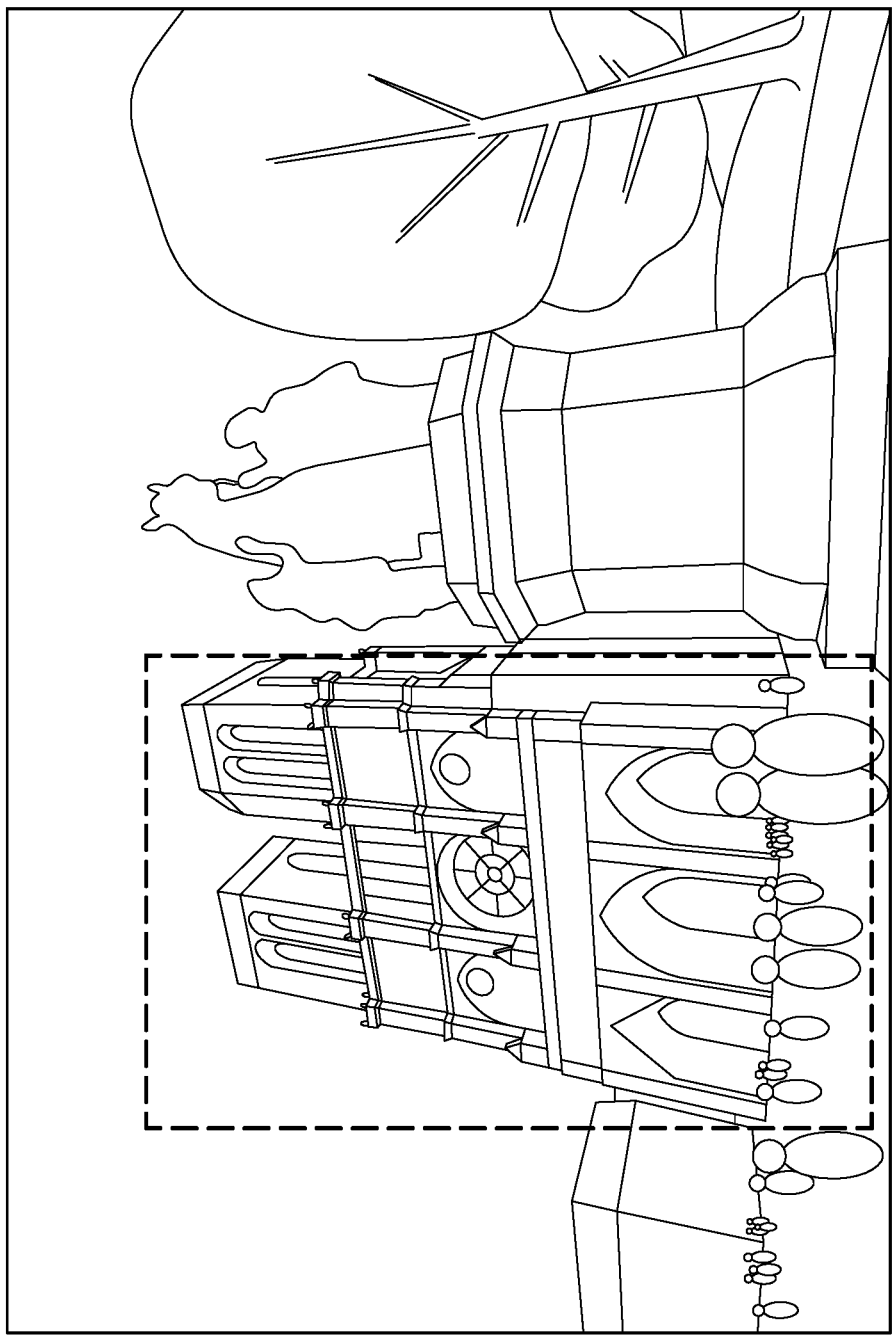
FIG. 32 is an image captured by an ultra-wide-angle camera module.

The image captured by the ultra-wide-angle camera module 60a enjoys a feature of multiple imaged objects. FIG. 32 is an image captured by the ultra-wide-angle camera module 60a.

Figure 33:
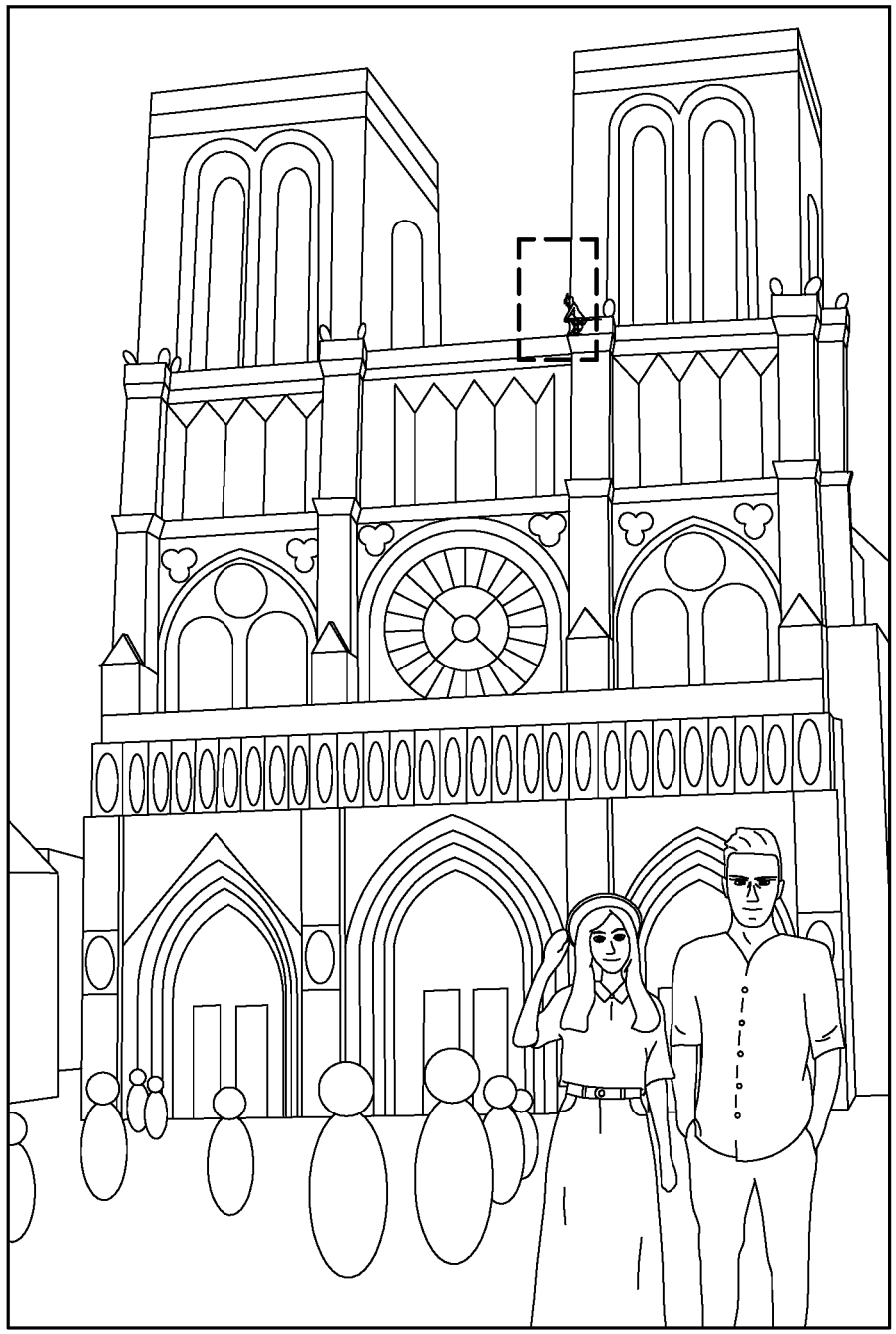
FIG. 33 is an image captured by a high pixel camera module.

The image captured by the high pixel camera module 60b enjoys a feature of high resolution and less distortion, and the high pixel camera module 60b can capture part of the image in FIG. 32. FIG. 33 is an image captured by the high pixel camera module 60b.

Figure 34:
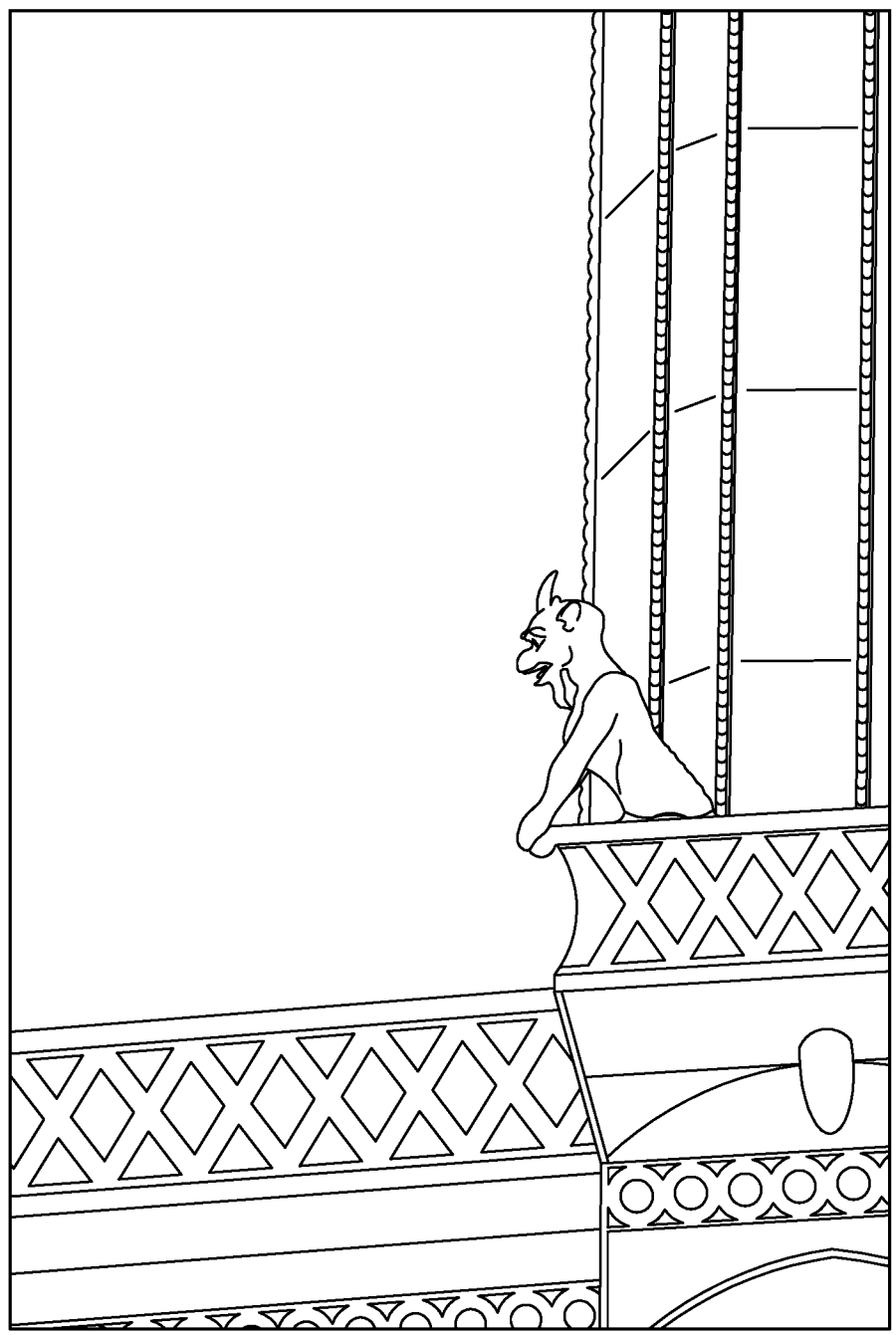
FIG. 34 is an image captured by a telephoto camera module.

The image captured by the telephoto camera module 60c enjoys a feature of high optical magnification, and the telephoto camera module 60c can capture part of the image in FIG. 33. FIG. 34 is an image captured by the telephoto camera module 60c. The maximum field of view (FOV) of the camera module C5 corresponds to the field of view in FIG. 34.

When a user captures images of an object, the light rays converge in the ultra-wide-angle camera module 60a, the high pixel camera module 60b or the telephoto camera module 60c to generate images, and the flash module 61 is activated for light supplement. The focus assist module 62 detects the object distance of the imaged object to achieve fast auto focusing. The image signal processor 63 is configured to optimize the captured image to improve image quality and provided zooming function. The light beam emitted from the focus assist module 62 can be either conventional infrared or laser. The display module 64 can include a touch screen, and the user is able to interact with the display module 64 and the image software processor having multiple functions to capture images and complete image processing. Alternatively, the user may capture images via a physical button. The image processed by the image software processor can be displayed on the display module 64.

7th Embodiment

Figure 35:
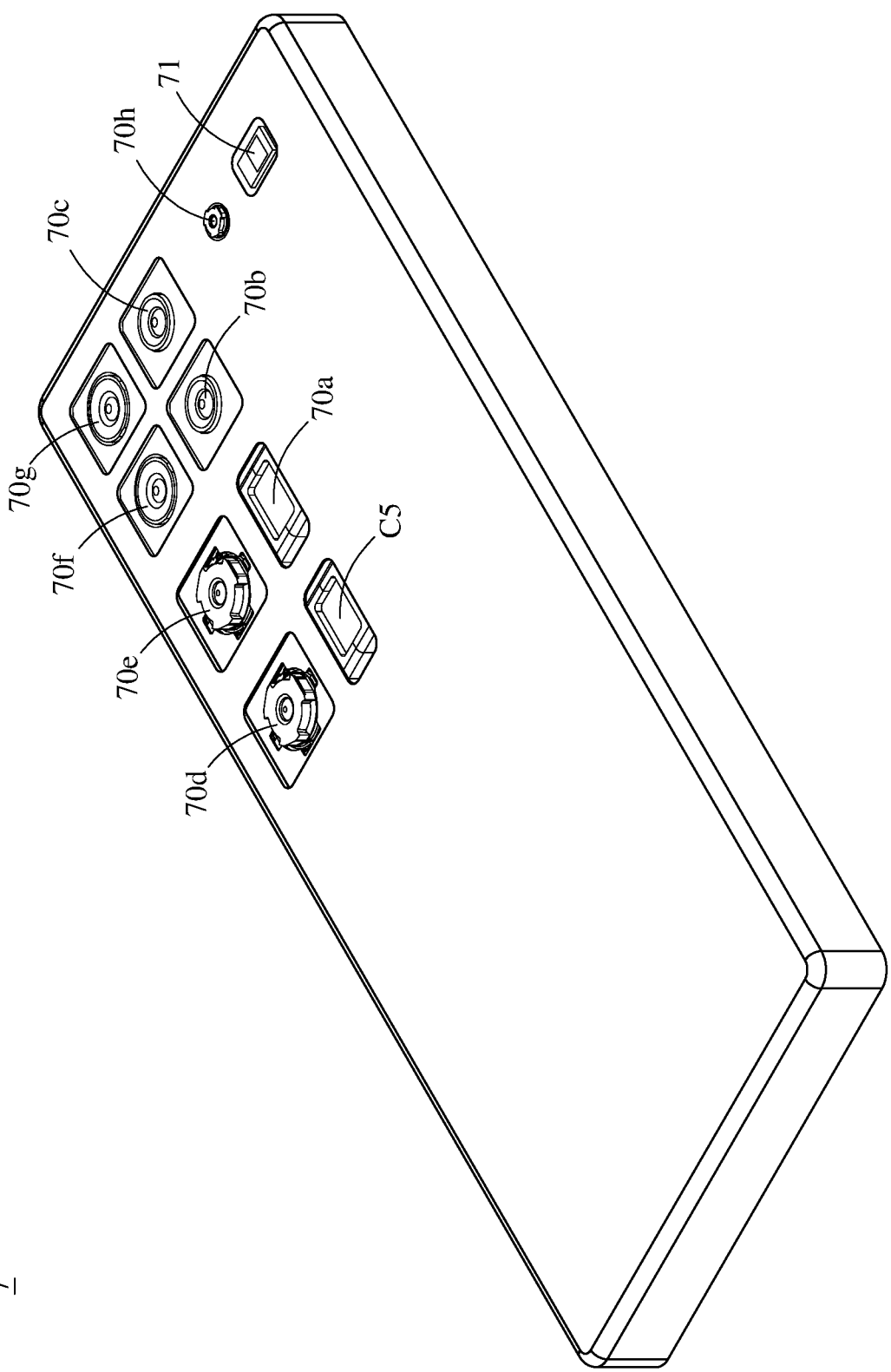
FIG. 35 is a perspective view of an electronic device according to the 7th embodiment of the present disclosure.

Please refer to FIG. 35, which is a perspective view of an electronic device according to the 7th embodiment of the present disclosure.

In this embodiment, an electronic device 7 is a smartphone including the camera module C5 disclosed in the 5th embodiment, a camera module 70a, a camera module 70b, a camera module 70c, a camera module 70d, a camera module 70e, a camera module 70f, a camera module 70g, a camera module 70h, a flash module 71, an image signal processor, a display module and an image software processor (not shown). The camera module C5, the camera module 70a, the camera module 70b, the camera module 70c, the camera module 70d, the camera module 70e, the camera module 70f, the camera module 70g and the camera module 70h are disposed on the same side of the electronic device 7, while the display module is disposed on the opposite side of the electronic device 7.

The camera module C5 is a telephoto camera module, the camera module 70a is a telephoto camera module, the camera module 70b is a telephoto camera module, the camera module 70c is a telephoto camera module, the camera module 70d is a wide-angle camera module, the camera module 70e is a wide-angle camera module, the camera module 70f is an ultra-wide-angle camera module, the camera module 70g is an ultra-wide-angle camera module, and the camera module 70h is a ToF (time of flight) camera module. In this embodiment, the camera module C5, the camera module 70a, the camera module 70b, the camera module 70c, the camera module 70d, the camera module 70e, the camera module 70f and the camera module 70g have different fields of view, such that the electronic device 7 can have various magnification ratios so as to meet the requirement of optical zoom functionality. In addition, the camera module C5 and the camera module 70a are telephoto camera modules having the optical folding component configuration. In addition, the camera module 70h can determine depth information of the imaged object. In this embodiment, the electronic device 7 includes a plurality of camera modules 1, 70a, 70b, 70c, 70d, 70e, 70f, 70g, and 70h, but the present disclosure is not limited to the number and arrangement of camera module. When a user captures images of an object, the light rays converge in the camera modules C5, 70a, 70b, 70c, 70d, 70e, 70f, 70g or 70h to generate an image(s), and the flash module 71 is activated for light supplement. Further, the subsequent processes are performed in a manner similar to the abovementioned embodiments, so the details in this regard will not be provided again.

The smartphones in the embodiments are only exemplary for showing the image capturing unit and the camera module of the present disclosure installed in an electronic device, and the present disclosure is not limited thereto. The image capturing unit and the camera module can be optionally applied to optical systems with a movable focus. Furthermore, the image capturing unit and the camera module feature good capability in aberration corrections and high image quality, and can be applied to 3D (three-dimensional) image capturing applications, in products such as digital cameras, mobile devices, digital tablets, smart televisions, network surveillance devices, dashboard cameras, vehicle backup cameras, multi-camera devices, image recognition systems, motion sensing input devices, wearable devices and other electronic imaging devices.

The foregoing description, for the purpose of explanation, has been described with reference to specific embodiments. It is to be noted that the present disclosure shows different data of the different embodiments; however, the data of the different embodiments are obtained from experiments. The embodiments were chosen and described in order to best explain the principles of the disclosure and its practical applications, to thereby enable others skilled in the art to best utilize the disclosure and various embodiments with various modifications as are suited to the particular use contemplated. The embodiments depicted above and the appended drawings are exemplary and are not intended to be exhaustive or to limit the scope of the present disclosure to the precise forms disclosed. Many modifications and variations are possible in view of the above teachings.

What is claimed is:

1. An imaging lens module, comprising:
    at least one imaging lens unit, comprising at least one plastic lens barrel and at least one plastic lens element group and having an optical axis, wherein the at least one plastic lens element group is accommodated in the at least one plastic lens barrel, and the optical axis passes through the at least one plastic lens element group;
    an optical folding component, configured to fold an incident optical path into the at least one imaging lens unit to coincide with the optical axis; and
    a sensing magnet group, located at an image side of the optical folding component, wherein the sensing magnet group comprises at least two sensing magnets that are sequentially disposed on the at least one plastic lens barrel along a direction in parallel with the optical axis;
    wherein the at least two sensing magnets are located at a same side with respect to a reference plane that passes through the optical axis, and the reference plane has a normal direction perpendicular to the optical axis;
    wherein when the at least two sensing magnets are observed from the direction in parallel with the optical axis, images of the at least two sensing magnets are at least partially overlapped;
    wherein two adjacent magnetic poles of the at least two sensing magnets are like poles;
    wherein a shortest distance along the direction in parallel with the optical axis between two magnetic like poles among the at least two sensing magnets located at the image side of the optical folding component is Dp, a longest distance along the direction in parallel with the optical axis between two magnetic poles among the at least two sensing magnets located at the image side of the optical folding component is Dm, a total quantity of the at least two sensing magnets is Nt, and the following condition is satisfied:

$0.1 < Nt \times Dp/(Dm-(Nt-1) \times Dp) < 3.2.$

2. The imaging lens module according to claim 1, wherein the shortest distance along the direction in parallel with the optical axis between two magnetic like poles among the at least two sensing magnets is Dp, the longest distance along the direction in parallel with the optical axis between two magnetic poles among the at least two sensing magnets is Dm, the total quantity of the at least two sensing magnets is Nt, and the following condition is satisfied:

$0.15 < Nt \times Dp/(Dm-(Nt-1) \times Dp) < 2.$

3. The imaging lens module according to claim 1, wherein the shortest distance along the direction in parallel with the optical axis between two magnetic like poles among the at least two sensing magnets is Dp, the longest distance along the direction in parallel with the optical axis between two magnetic poles among the at least two sensing magnets is Dm, and the following condition is satisfied:

$0 < Dp/Dm < 1.$

4. The imaging lens module according to claim 3, wherein the shortest distance along the direction in parallel with the optical axis between two magnetic like poles among the at least two sensing magnets is Dp, the longest distance along the direction in parallel with the optical axis between two magnetic poles among the at least two sensing magnets is Dm, and the following condition is satisfied:

$0.1 < Dp/Dm < 0.8.$

5. The imaging lens module according to claim 1, further comprising:
    a base, supporting the at least one imaging lens unit;
    a plurality of rollable supporters, disposed between the at least one imaging lens unit and the base;
    a frame component, coupled to the base;
    a flexible printed circuit board, supported by the frame component;
    a driving coil group, disposed on the flexible printed circuit board along a direction in parallel with the optical axis; and
    a hall sensing component group, comprising at least two hall sensing components, wherein the at least two hall sensing components are sequentially soldered on the flexible printed circuit board along a direction in parallel with the optical axis.

6. The imaging lens module according to claim 5, wherein the shortest distance along the direction in parallel with the optical axis between two magnetic like poles among the at least two sensing magnets is Dp, a shortest distance along the direction in parallel with the optical axis between the at least two hall sensing components is Dh, and the following condition is satisfied:

$0 < Dh/Dp < 3.$

7. The imaging lens module according to claim 5, wherein the driving coil group and the sensing magnet group are disposed opposite to each other so as to generate a driving magnetic force therebetween for moving the at least one plastic lens barrel along a direction in parallel with the optical axis.

8. The imaging lens module according to claim 7, wherein the hall sensing component group and the sensing magnet group are disposed opposite to each other so as to sense a displacement of the at least one plastic lens barrel along the direction in parallel with the optical axis.

9. The imaging lens module according to claim 5, further comprising at least one fixed imaging lens unit, wherein the at least one fixed imaging lens unit comprises at least one fixed plastic lens barrel and at least one fixed plastic lens element group that is accommodated in the at least one fixed plastic lens barrel, the at least one fixed imaging lens unit is immovable with respect to the base, and the at least one imaging lens unit is movable with respect to the base.

10. The imaging lens module according to claim 5, further comprising an optical image stabilizer configured to be disposed on an image sensor for stabilizing an optical image signal on the image sensor.

11. The imaging lens module according to claim 10, further comprising an auxiliary sensing magnet group, an auxiliary driving coil group and an auxiliary hall sensing component group that are disposed on the optical image stabilizer.

12. The imaging lens module according to claim 5, wherein the base has a guide groove extending along a direction in parallel with the optical axis and facing the at least one imaging lens unit.

13. The imaging lens module according to claim 12, wherein the plurality of rollable supporters are disposed in the guide groove.

14. An electronic device, comprising:
the imaging lens module of claim 1; and
an image sensor, disposed on an image surface of the imaging lens module, wherein the image sensor is configured to convert light passing through the at least one imaging lens unit into an optical image signal.

* * * * *